United States Patent
Noguchi et al.

(10) Patent No.: US 7,297,415 B2
(45) Date of Patent: Nov. 20, 2007

(54) PROCESSES FOR PRODUCING POLYMERIC FLUORESCENT MATERIAL AND POLYMERIC LUMINESCENT ELEMENT

(75) Inventors: Takanobu Noguchi, Tsukuba (JP); Masato Ueda, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 287 days.

(21) Appl. No.: 10/480,332

(22) PCT Filed: Jun. 26, 2001

(86) PCT No.: PCT/JP01/05454

§ 371 (c)(1),
(2), (4) Date: Jun. 21, 2004

(87) PCT Pub. No.: WO03/000821

PCT Pub. Date: Jan. 3, 2003

(65) Prior Publication Data

US 2004/0219388 A1  Nov. 4, 2004

(51) Int. Cl.
*H05B 33/14* (2006.01)
*C08J 3/00* (2006.01)
*C08G 61/00* (2006.01)

(52) U.S. Cl. ............... 428/690; 428/917; 313/504; 257/40; 257/103; 528/486; 528/489

(58) Field of Classification Search ........... 428/690, 428/917; 313/504; 257/40, 103; 528/486, 528/489
See application file for complete search history.

(56) References Cited

U.S. PATENT DOCUMENTS 4,578,433 A  3/1986  Muenstedt et al.

FOREIGN PATENT DOCUMENTS

| EP | 0 358 382 A2 | 3/1990 |
|---|---|---|
| JP | 59-194393 A | 11/1984 |
| JP | 63-112618 A | 5/1988 |
| JP | 2-300233 A | 12/1990 |
| JP | 3-153510 A | 7/1991 |
| JP | 03-244630 A | 10/1991 |
| JP | 6-279572 A | 10/1994 |
| JP | 9-40587 A | 2/1997 |
| JP | 2001-76880 A | 3/2001 |
| JP | 2001-181618 A | 7/2001 |
| JP | 2001-247861 A | 9/2001 |
| WO | WO 90/13148 A1 | 1/1990 |

OTHER PUBLICATIONS

C. Adachi et al., "Electroluminescence in Organic Films with Three-Layer Structure", Japanese Journal of Applied Physics, vol. 27, No. 2, Feb. 1988, pp. L269-L271.
C. W. Tang et al., "Electroluminescence of doped organic thin films", Journal of Applied Physics, vol. 65, No. 9, May 1, 1989, pp. 3610-3616.
D. Braun et al., "Visible light emission from semiconducting polymer diodes", Applied Physics Letter, vol. 58, No. 16, May 6, 1999, pp. 1982-1984.
Y. Ohmori et al., "Blue Electroluminescent Diodes Utilizing Poly(alkylfluorene)", Japanese Journal of Applied Physics, vol. 30, No. 11B, Nov. 1991, pp. L1941-L1943.
G. Grem et al., "Realization of a Blue-Light-Emitting Device using Poly(ρ-phenylene)", Advanced Materials, vol. 4, No. 1, Jan. 1992, pp. 36-37.

*Primary Examiner*—Duc Truong
(74) *Attorney, Agent, or Firm*—Sughrue Mion, PLLC

(57) ABSTRACT

A method for producing a polymeric fluorescent substance characterized by comprising the step of treating with an acid a polymeric fluorescent substance that is fluorescent in a solid state and has a polystyrene equivalent number average molecular weight of $1\times10^4$ to $1\times10^8$. A method for producing a polymeric fluorescent substance characterized by comprising the steps of treating with an acid a polymeric fluorescent substance that is fluorescent in a solid state and has a polystyrene equivalent number average molecular weight of $1\times10^4$ to $1\times10^8$ and treating it with an alkali. A method for producing a polymeric fluorescent substance characterized by comprising the steps of treating with an acid a polymeric fluorescent substance that is fluorescent in a solid state and has a polystyrene equivalent number average molecular weight of $1\times10^4$ to $1\times10^8$, treating it with an alkali and finally treating it with a substance that does not contain an acid or an alkali.

17 Claims, No Drawings

PROCESSES FOR PRODUCING POLYMERIC FLUORESCENT MATERIAL AND POLYMERIC LUMINESCENT ELEMENT

TECHNICAL FIELD

The present invention relates to a method for producing a polymeric fluorescent substance and a polymer light emitting device (hereinafter sometimes referred to as "polymer LED") using the polymeric fluorescent substance produced by the method.

BACKGROUND ART

An inorganic electroluminescence device (hereinafter sometimes referred to as "inorganic EL device") using an inorganic fluorescent substance as a light emitting material has been used, for example, in a display device such as a sheet-shaped light source as a backlight or a flat panel display. However, an inorganic electroluminescence device needs a high voltage alternating current for light emitting.

In recent years, an organic electroluminescence device (hereinafter sometimes referred to as "organic EL device") has been reported which has a two-layered structure in which an organic fluorescent dye as a light emitting layer and an organic charge transport compound that is used in a photosensitizer of electrophotography are laminated on one another (JP-A-59-194393). A lot of attempts to use the organic EL device for device structures, organic fluorescent dyes and organic charge transport compounds have been reported because the organic EL device has the feature that it can easily provide light emissions of many colors in addition to the features of low voltage drive and high luminance in comparison with the inorganic EL device (Jpn. J. Appl. Phys., Vol. 27, page L269 (1988)), (J. Appl. Phys., Vol. 65, page 3610 (1989)).

Further, apart from the organic EL device that mainly uses a low molecular weight organic compound, WO9013148, JP-A-3-244630, Appl. Phys. Lett., Vol. 58, page 1982 (1991) or the like propose a polymer LED that uses a high molecular weight light emitting material. WO9013148 describes that a poly(p-phenylene vinylene) (hereinafter sometimes referred to as "PPV") thin film that can be obtained by forming a film of a soluble precursor on an electrode followed by heat treatment to convert it into a conjugated polymer and a device using the same.

Moreover, JP-A-3-244630 describes a conjugated polymer characterized in that the polymer itself is soluble in a solvent and requires no heat treatment. Further, Appl. Phys. Lett., Vol. 58, page 1982 (1991) describes a polymer light emitting material soluble in a solvent and a polymer LED produced by using the same.

For the polymer LED, a film of an organic layer can be easily formed by coating. Therefore, in comparison with the case of depositing a low molecular weight fluorescent substance, the polymer LED can be advantageously produced in a large size with a low cost. Since the polymer LED is a polymer, it is considered excellent in mechanical strength of a film.

As the polymeric fluorescent substance to be used in these polymer LED, besides the above poly(p-phenylene vinylene), polyfluorene (Jpn. J. Appl. Phys., Vol. 30, page L1941 (1991), a polyparaphenylene derivative (Adv. Mater., Vol. 4, page 36 (1992) have been heretofore reported.

Thus, a method for producing a polymeric fluorescent substance that can provide a polymer LED with longer life has been demanded.

DISCLOSURE OF THE INVENTION

An object of the present invention is to provide a method for producing a polymeric fluorescent substance with long life when used in a polymer LED and a polymer LED with long life using the polymeric fluorescent substance obtained by the production method.

The present inventors intensively studied taking into account the above circumstances and found that a polymer LED device with long life can be obtained by using the polymeric fluorescent substance produced by a method comprising the step of treating the polymeric fluorescent substance with an acid. Thus, they completed the present invention.

That is, the present invention relates to [1] a method for producing a polymeric fluorescent substance comprising the step of treating with an acid a polymeric fluorescent substance that is fluorescent in a solid state and has a polystyrene equivalent number average molecular weight of $1 \times 10^4$ to $1 \times 10^8$. The present invention also relates to [2] a method for producing a polymeric fluorescent substance comprising the step of treating with an acid a polymeric fluorescent substance that is fluorescent in a solid state and has a polystyrene equivalent number average molecular weight of $1 \times 10^4$ to $1 \times 10^8$ and treating it with an alkali. The present invention also relates to [3] a method for producing a polymeric fluorescent substance comprising the step of treating with an acid a polymeric fluorescent substance that is fluorescent in a solid state and has a polystyrene equivalent number average molecular weight of $1 \times 10^4$ to $1 \times 10^8$, treating it with an alkali and finally treating it with a substance that does not contain an acid or an alkali. The present invention also relates to [4] a polymer light emitting device that has at least one light emitting layer containing a polymeric fluorescent substance between a pair of electrodes consisting of an anode and a cathode at least one of which is transparent or semitransparent, wherein the light emitting layer contains the polymeric fluorescent substance produced by the production method according to [1] to [3]. Further, the present invention relates to [5] a sheet-shaped light source using the polymer light emitting device according to the above [4]. Then, the present invention relates to [6] a segment display device using the polymer light emitting device according to the above [4]. Next, the present invention relates to [7] a dot matrix display device using the polymer light emitting device according to the above [4]. Further, the present invention relates to [8] a liquid crystal display device with the sheet-shaped light source according to the above [4] as a backlight.

BEST MODE FOR CARRYING OUT THE INVENTION

A method for producing a polymeric fluorescent substance of the present invention and a polymer LED using a polymeric fluorescent substance produced by the production method will be described below in detail.

The method for producing the polymeric fluorescent substance of the present invention is characterized by comprising the step of treating with an acid the polymeric fluorescent substance that is fluorescent in a solid state and has a polystyrene equivalent number average molecular weight of $1 \times 10^4$ to $1 \times 10^8$ (hereinafter sometimes referred to as "starting polymeric fluorescent substance").

The method for producing the polymeric fluorescent substance of the present invention is characterized by comprising the steps of treating with an acid the polymeric fluorescent substance that is fluorescent in a solid state and has a polystyrene equivalent number average molecular weight of $1 \times 10^4$ to $1 \times 10^8$ (hereinafter sometimes referred to as "starting polymeric fluorescent substance") and treating it with an alkali.

The method for producing the polymeric fluorescent substance of the present invention is characterized by comprising the steps of treating with an acid the polymeric fluorescent substance that is fluorescent in a solid state and has a polystyrene equivalent number average molecular weight of $1 \times 10^4$ to $1 \times 10^8$ (hereinafter sometimes referred to as "starting polymeric fluorescent substance"), treating it with an alkali and then finally treating it with a substance that does not contain an acid or an alkali.

First, the treatment with an acid will be described in detail.

In the present invention, the acid may be any organic substance or inorganic substance that exhibits an acidic property in every meaning and includes, for example, an organic acid or inorganic acid. An organic acid is preferred due to its high efficiency of treatment.

Examples of the organic acid include alkanecarboxylic acids, alkenecarboxylic acids, aromatic carboxylic acids, heterocyclic carboxylic acids, aromatic alcohols, alkanesulfonic acids, alkenesulfonic acids, aromatic sulfonic acids, heterocyclic sulfonic acids, alkanesulfinic acids, alkenesulfinic acids, aromatic sulfinic acids, heterocyclic sulfinic acids, alkanesulfenic acids, alkenesulfenic acids, aromatic sulfenic acids, heterocyclic sulfenic acids, alkanephosphonic acids, alkenephosphonic acids, aromatic phosphonic acids, heterocyclic phosphonic acids, alkanephosphenic acids, alkenephosphenic acids, aromatic phosphenic acids, heterocyclic phosphenic acids, alkanephosphinic acids, alkenephosphinic acids, aromatic phosphinic acids and heterocyclic phosphinic acids.

More specific examples of the organic acid include formic acid, acetic acid, propionic acid, oxalic acid, citric acid, tartaric acid, maleic acid, phthalic acid, benzoic acid, 4-pyridinecarboxylic acid, phenol, methanesulfonic acid, propenesulfonic acid, toluenesulfonic acid, 2-thiophenesulfonic acid, ethanesulfenic acid, 1-butenesulfenic acid, toluenesulfenic acid, 2-thiophenesulfenic acid, ethanesulfinic acid, 1-butenesulfinic acid, toluenesulfinic acid, 2-thiophenesulfinic acid, ethylphosphonic acid, propenephosphonic acid, benzenephosphonic acid, 3-thiophenephosphonic acid, ethylphosphenic acid, propenephosphenic acid, benzenephosphenic acid, 3-thiophenephosphenic acid, ethylphosphinic acid, propenephosphinic acid, benzenephosphinic acid and 3-thiophenephosphinic acid. Formic acid, acetic acid, propionic acid, oxalic acid, citric acid and tartaric acid are more preferred, and oxalic acid, citric acid and a tartaric acid are further preferred.

Examples of the inorganic acid include a hydrohalic acid, a hydroacid of a sulfur oxide, a hydroacid of a phosphorus oxide, a hydroacid of a nitrogen oxide, and a hydroacid of a metal oxide.

Specific examples of the inorganic acid include sulfuric acid, hydrochloric acid, nitric acid, phosphoric acid, carbonic acid, chlorous acid, nitrous acid, selenious acid, arsenous acid, phosphorous acid, sulfurous acid, periodic acid, chromic acid, silicic acid, hypochlorous acid, hypophosphorous acid, cyanic acid, selenic acid, thiocyanic acid, thiosulfuric acid, dichromic acid, diphosphoric acid, vanadic acid, hydrofluoric acid, boric acid and iodic acid. Sulfuric acid, hydrochloric acid, nitric acid and phosphoric acid are preferred.

In the step of treating with an acid, a single acid or a mixture of two or more of these acids can be used.

In the present invention, "the step of treating with an acid" means the step of bring the starting polymeric fluorescent substance into contact with an acid.

Examples of the method for treating the starting polymeric fluorescent substance with an acid include, for example:
1) bringing the starting polymeric fluorescent substance in a liquid state into contact with an acid in a liquid state;
2) bringing the starting polymeric fluorescent substance in a solid state into contact with an acid in a liquid state;
3) bringing the starting polymeric fluorescent substance in a liquid state into contact with an acid in a solid state;
4) bringing the starting polymeric fluorescent substance in a liquid state into contact with an acid in a gaseous state; and
5) bringing the starting polymeric fluorescent substance in a solid state into contact with an acid in a gaseous state.

Among them, the method of 1) is preferred because the starting polymeric fluorescent substance contacts an acid well.

Here, the liquid state includes the state in which the starting polymeric fluorescent substance is dissolved in a solvent.

The step of treating with an acid preferably includes stirring or shaking so as to improve the efficiency of treatment. The step of treating with an acid may be included twice or more. Further, when the step of treating with an acid is included twice or more, the type, concentration or the like of the acid may be changed.

Further, the method for producing the polymeric fluorescent substance of the present invention may include a step other than the step of treating with an acid, as appropriate.

Examples of the step other than the step of treating with an acid include: a step of removing the acid; when using a solvent, a step of removing the solvent; when using a solvent for separating phases, the step of separating the phases of the solution; and the step of purification by reprecipitation, chromatography or the like.

Among them, it is preferable to include the step of removing an acid and the step of purification, because the steps remove unnecessary products.

The method of the above 1) will be described below in further detail.

In the method of 1), the step of treating the starting polymeric fluorescent substance with an acid is preferably the step of bringing the solution of the acid into contact with the solution of the polymeric fluorescent substance in a solvent because of the high efficiency of treatment. The solvent to be used for the solution of the acid may be water or other solvents.

Meanwhile, the solvent that separates the phase of the starting polymeric fluorescent substance in a liquid state from the phase of the acid in a liquid state can easily separate the polymeric fluorescent substance from the acid. Therefore such a solvent is more preferred.

For the method for separating the phase containing the starting polymeric fluorescent substance from the phase containing the acid, both dissolved in a solvent in liquid states, it is preferred that the acid is dissolved in water to make an aqueous solution, and the starting polymeric fluorescent substance is dissolved in a solvent that separates from the phase of the aqueous solution of the acid.

The concentration of the aqueous solution of the acid is not particularly limited but adjusted to about 0.1 to 30 wt %.

When the acidity of the aqueous solution of the acid is too high, the polymeric fluorescent substance to be treated is expected to decompose, hence the aqueous solution of the acid has a pH of preferably not less than 0.1 to not more than 5.5 and more preferably not less than 0.5 to not more than 4.5. Water to be used here is preferably water containing only a small amount of impurities such as ions. For example, distilled water, ion exchange water, pure water and extrapure water are preferred. Among them, pure water and extrapure water are preferable, and extrapure water is particularly preferred. A specific index of purity of the pure water is an electrical conductivity, and water of an electrical conductivity of 10 µS/cm or less is preferable and more preferably 1 µS/cm or less.

The solvent that dissolves the polymeric fluorescent substance may be any solvent that dissolves the polymeric fluorescent substance well. The examples include a chlorine-containing solvent such as chloroform, methylene chloride and dichloroethane; an ether solvent such as tetrahydrofuran; and an aromatic hydrocarbon solvent such as toluene, xylene, mesitylene, tetralin, decalin, n-butylbenzene, but not particularly limited thereto. Among them, the solvents that separate from the phase of the solution of the acid (or water) are preferred. Chloroform, tetrahydrofuran and toluene are particularly preferred.

The temperature for the treatment with the acid is not particularly limited. It is possible to conduct the treatment at room temperature to a temperature lower than the boiling point of the solvent. Temperatures between room temperature to 50° C. are preferred.

Next, the following is the specific description of one example of the methods for bringing the aqueous solution of the acid into contact with the solution of the polymeric fluorescent substance in the solvent that separates from the phase of the aqueous solution of the acid.

First, the starting polymeric fluorescent substance is dissolved in a solvent that well dissolves the polymeric fluorescent substance and separates from the phase of the aqueous solution of the acid (or water), for example, in chloroform, and then the solution is brought into contact with the solution of the acid while stirring for example (step of treating with an acid). After allowed to stand still, the phase of the solution of the acid is separated from the phase that contains the polymeric fluorescent substance.

The phase containing the polymeric fluorescent substance that was obtained by separating the phases of the solution is further brought into contact with the aqueous solution of the acid. The step of treating with an acid is repeated for an adequate number of times.

Then, the phase containing the polymeric fluorescent substance that was obtained by separating the phases of the solution was brought into contact with water to remove the acid remaining in the phase containing the polymeric fluorescent substance. By repeating the removal of the acid in the phase containing the polymeric fluorescent substance until the pH of the aqueous phase becomes 7, a solution of the polymeric fluorescent substance is obtained. The solution is added dropwise into a poor solvent for the polymeric fluorescent substance such as methanol, while stirring, to produce the precipitate of the polymeric fluorescent substance. The precipitate is filtered, washed with ethanol and then dried under a reduced pressure to obtain the polymeric fluorescent substance.

Examples of method 2) include a method comprising mixing a liquid acid with a solid powder of the starting polymeric fluorescent substance without using a solvent and then treating by washing operation of stirring repulp type; and a method comprising dissolving the acid in an organic solvent and mixing it with a solid powder of the polymeric fluorescent substance and treating by washing operation of stirring repulp type. When using a solid powder of the starting polymeric fluorescent substance in the present method, the acid or other unnecessary ingredients can be removed from the solid powder of the starting polymeric fluorescent substance by treating with the acid followed by filtration. Further, the acid remaining in the polymeric fluorescent substance can be removed with an organic solvent or water by washing operation of the stirring repulp type.

Examples of method 3) include a method in which the starting polymeric fluorescent substance in a liquid state is treated by passing through a column filled with the acid in a solid state.

Methods 4) and 5) are performed by bringing the gaseous acid into contact with the starting polymeric fluorescent substance in a liquid or solid state, where the gaseous acid means an organic or inorganic gaseous acid that is acidic. Specifically, it means hydrogen chloride gas, hydrogen bromide gas, hydrogen fluoride gas, gaseous formic acid, gaseous oxalic acid, gaseous trifluoroacetic acid or the like.

In the above step of treating with an acid, the amounts of the followings contained in the starting polymeric fluorescent substance material are preferably reduced: a metal such as, for example, lithium, sodium, potassium, magnesium, calcium, iron, copper, manganese, aluminum, zinc, nickel, chromium and lead; and a basic ingredient such as, for example, potassium tert-butoxide.

Next, the step of treating with an alkali will be described below.

In the production method of the present invention, a good solvent for the crude polymeric fluorescent substance is preferably used because it is preferable for the crude polymeric fluorescent substance to be sufficiently dissolved in order to be uniformly treated with the alkali.

The organic solvent may be any solvent that can dissolve the crude polymeric fluorescent substance without particular limitation. However, examples of good solvents for the crude polymeric fluorescent substance include chloroform, methylene chloride, dichloroethane, tetrahydrofuran, toluene, xylene, mesitylene, tetralin, decalin, n-butylbenzene, and dioxane. Typically 0.1 wt % or more crude polymeric fluorescent substances can be dissolved in these solvents, but it depends on the structure or molecular weight of the crude polymeric fluorescent substances.

The alkali to be used in the production method of the present invention preferably has a pKa value of 10 or more.

Examples of the alkali include a metal alkoxide, a metal hydroxide, a metal amide compound, a metal hydride compound, ammonia and an amine.

Examples of the metal alkoxide include $LiOCH_3$, $NaOCH_3$, $KOCH_3$, $LiOC_2H_5$, $NaOC_2H_5$, $KOC_2H_5$, $LiO(t-C_4H_9)$, $NaO(t-C_4H_9)$ and $KO(t-C_4H_9)$. Examples of the metal hydroxide include LiOH, NaOH and KOH. Examples of the metal amide compound include $LiNH_2$, $NaNH_2$, $KNH_2$, $LiN(i-C_3H_7)_2$, $NaN(i-C_3H_7)_2$ and $KN(i-C_3H_7)_2$. Examples of the metal hydride compound include LiH, NaH and KH. Examples of the amine include triethylamine, pyridine, 4-dimethylaminopyridine and diazabicycloundecane.

Among the above, $LiO(t-C_4H_9)$, $NaO(t-C_4H_9)$, $KO(t-C_4H_9)$, $LiN(i-C_3H_7)_2$, $NaN(i-C_3H_7)_2$, $KN(i-C_3H_7)_2$, ammonia and amines are preferable with respect to the solubility to an organic solvent.

Further, ammonia and triethylamine are more preferable because they enhance fluorescent intensity. Ammonia is particularly preferable because it has a high volatility and is unlikely to remain after treatment.

The method for producing the polymeric fluorescent substance of the present invention comprises the step of bringing the crude polymeric fluorescent substance into contact with the alkali. This step may be repeated twice or more. In the step of bringing the crude polymeric fluorescent substance into contact with the alkali, it is preferable to contact the crude polymeric fluorescent substance dissolved in an organic solvent with the alkali with respect to the contact efficiency.

Examples of the method for bringing into contact with an alkali include (a) a method in which the alkali is just added as it is to a solution of a crude polymeric fluorescent substance; (b) a method in which a solution of an alkali in a solvent is added to a solution of a crude polymeric fluorescent substance; (c) a method in which a solution of a crude polymeric fluorescent substance is added to a solution of an alkali; and (d) a method in which a crude polymeric fluorescent substance is dispersed in a solvent in which an alkali is dissolved.

In methods (b) and (c), the solvent in which the alkali is to be dissolved may be an organic solvent or water. When the crude polymeric fluorescent substance is dissolved in an organic solvent, the solvent in which the alkali is to be dissolved may be a solvent homogeneously mixed or unmixed with the organic solvent in which the crude polymeric fluorescent substance is dissolved. Among organic solvents, preferred is the same organic solvent as that in which the crude polymeric fluorescent substance is dissolved.

In the step of bringing into contact with the alkali, contact efficiency between the alkali and the polymeric fluorescent substance may be improved by stirring and shaking the solution, for example, as necessary.

In order to obtain a sufficient solubility improving effect, the time for bringing into contact with the alkali is usually not less than 30 minutes to not more than 20 hours, preferably not less than 1 hour to not more than 20 hours, but not particularly limited thereto. Further, the temperature for bringing into contact with the alkali is usually not less than 10° C. to not more than 200° C., preferably not less than room temperature to less than the boiling point of a solvent. The temperature is practically and more preferably not less than 30° C. to not more than 150° C., further preferably not less than 50° C. to not more than 100° C., depending on the solvent to be used. However, when using a highly volatile alkali such as ammonia, it is preferable to treat around room temperature. During the treatment, in order to inhibit the deterioration of the polymeric fluorescent substance, it is preferable to seal in an inert atmosphere and to shield from light having a wavelength absorbable by the polymeric fluorescent substance solution.

In the present invention, the step of bringing the crude polymeric fluorescent substance into contact with the alkali may be performed continuously with the step of synthesizing the crude polymeric fluorescent substance without separating the two steps. For example, there is a method in which a solution of the crude polymeric fluorescent substance is brought into contact with the alkali without separation of the fluorescent substance as a precipitate. The present production method may comprise other steps such as neutralization, washing, reprecipitation, drying, as required, after bringing into contact with the alkali.

After the above step of bringing into contact with the alkali, the step for removing the alkali from the polymeric fluorescent substance is preferably provided. The alkali may be removed by sufficiently washing after neutralization treatment or by sufficiently washing with a solvent excellent in dissolving the alkali.

The alkali may be removed by once dissolving the polymeric fluorescent substance obtained by bringing into contact with the alkali in a good solvent and then reprecipitating it in a poor solvent.

A highly volatile alkali such as ammonia may be removed only by drying under a reduced pressure or only by heating in an inert atmosphere.

The step of treating with a substance that does not contain an acid or an alkali will be described below in detail.

In the present invention, the substance that does not contain an acid or an alkali may be any organic substance or inorganic substance that does not show an acid or alkali property in every meaning. The examples include a neutral organic solvent, neutral water, or the like. Neutral water has a high efficiency of treatment, and therefore is preferred.

Examples of the neutral organic solvent include alkanes, alkenes, aromatic compounds, heterocyclic compounds, alcohols, ethers, ketones, alkane sulfonates, alkane carboxylates, alkene sulfonates, aromatic sulfonates, heterocyclic sulfonates and phosphates.

More specific examples of the neutral organic solvent include hexane, hexene, benzene, toluene, 2-methylfuran, 2-methylthiophene, ethanol, methanol, diethylether, t-butyl methyl ether, acetone, methyl isobutyl ketone, methyl ethanesulfonate, ethyl acetate, methyl propionate, ethyl 2-butenate, methyl toluenesulfonate, ethyl 2-thiophenesulfonate and trimethyl phosphate. Hexane, toluene, methanol, diethyl ether, acetone or the like is further preferred.

Examples of the neutral water include distilled water, ion exchange water and a buffer solution with a pH of about 7. Distilled water, ion exchange water or the like is preferred.

In the step of treating with the substance that does not contain an acid or an alkali, these neutral substances can be used alone or in admixture of two or more kinds.

Further, examples of the substance that does not contain a solid acid or an alkali include neutral silica gel, alumina gel, activated carbon, cerite and the like.

In the present invention, "the step of treating with the substance that does not contain an acid or an alkali" means the step of bringing the starting polymeric fluorescent substance into contact with the substance that does not contain an acid or an alkali.

Examples of the method for treating the starting polymeric fluorescent substance with the substance that does not contain an acid or an alkali include:

1) a method in which the starting polymeric fluorescent substance in a liquid state is brought into contact with the substance that does not contain an acid or an alkali in a liquid state;
2) a method in which the starting polymeric fluorescent substance in a solid state is brought into contact with the substance that does not contain an acid or an alkali in a liquid state; and
3) a method in which the starting polymeric fluorescent substance in a liquid state is brought into contact with the substance that does not contain an acid or an alkali in a solid state. Among them, method 1) is preferred because the starting polymeric fluorescent substance contacts the acid well.

Here, the liquid state includes the state in which the starting polymeric fluorescent substance is dissolved in a solvent or other states.

In the step of treating with the substance that does not contain an acid or an alkali preferably, stirring, shaking and the like are preferably carried out to improve the efficiency of the treatment. The step of treating with the substance that does not contain an acid or an alkali may be included twice or more. Further, when the step of treating with the substance that does not contain an acid or an alkali is included twice or more, the type, concentration or the like of the substance that does not contain an acid or an alkali then used may be changed.

Further, the method for producing the polymeric fluorescent substance of the present invention may include a step other than the step of treating with the substance that does not contain an acid or an alkali, as appropriate.

Examples of the step other than the step of treating with the substance that does not contain an acid or an alkali include a step of removing the substance that does not contain an acid or an alkali; a step of removing the solvent, when using another solvent; the step of separating the phases of the solution, when using a solvent that separates phases; and a step of purification by reprecipitation chromatography or the like.

Among them, it is preferable to include the step of removing the substance that does not contain an acid or an alkali and the step of purification, because the steps remove unnecessary products.

In the above methods 1) and 2), the substance that does not contain an acid or an alkali is preferably water having a pH of 6.5 to 7.5. At this time, water to be used here is preferably water containing only a small amount of impurities such as ions. For example, distilled water ion exchange water, pure water, and extrapure water are preferred. Among them, pure water and extrapure water are preferable, and extrapure water is particularly preferred. A specific purity index of the pure water is electrical conductivity, and the value is preferably 10 µS/cm or less, more preferably 1 µS/cm or less.

The case using water will be described below.

The above method 1) will be described in further detail.

In method 1), the step of treating the starting polymeric fluorescent substance with the substance that does not contain an acid or an alkali is preferably a step in which water is brought into contact with a solution of the polymeric fluorescent substance in a solvent, because of the high efficiency of treatment.

Meanwhile, the solvent that separates the phase of the starting polymeric fluorescent substance in a liquid state from the phase of water can easily separate the polymeric fluorescent substance. Therefore such a solvent is preferred.

For the method for separating the starting polymeric fluorescent substance and water, both in liquid states, it is preferable that the starting polymeric fluorescent substance is dissolved in a solvent that separates from the phase of water.

The solvent that dissolves the polymeric fluorescent substance may be any solvent that dissolves the polymeric fluorescent substance well, without particular limitation. The examples include a chlorine-containing solvent such as chloroform, methylene chloride and dichloroethane; an ether solvent such as tetrahydrofuran; and an aromatic hydrocarbon solvent such as toluene, xylene, mesitylene, tetralin, decalin and n-butylbenzene, but not particularly limited thereto. Among them, the solvents that separate from the phase of water are preferred. Chloroform, tetrahydrofuran and toluene are particularly preferred.

The temperature for the treatment with water is not particularly limited. It may be from room temperature to a temperature lower than the boiling point of the solvent, but the temperatures between room temperature to 50° C. are preferred.

Next, the following is the specific description of one example of the method for bringing water into contact with the solution of the polymeric fluorescent substance in a solvent that separates from the phase of the aqueous solution of the acid.

First, the starting polymeric fluorescent substance is dissolved in a solvent that well dissolves the polymeric fluorescent substance and separates from the phase of water, for example, in chloroform, and then the solution is brought into contact with water while stirring (step of treating with the substance that does not contain an acid or an alkali). After allowed to stand still, the phase of water is separated from the phase that contains the polymeric fluorescent substance.

The phase containing the polymeric fluorescent substance that was obtained by separating the phases is further brought into contact with water. The step of treating with the substance that does not contain an acid or an alkali is then repeated an adequate number of times.

Then, the solution containing the polymeric fluorescent substance is added dropwise to a poor solvent for the polymeric fluorescent substance, for example, to methanol, while stirring, to produce a precipitate of the polymeric fluorescent substance. The precipitate is filtered, washed with ethanol and then dried under a reduced pressure to obtain the polymeric fluorescent substance.

Examples of method 2) include a method of mixing water with a solid powder of the starting polymeric fluorescent substance and then treating by washing operation of stirring repulp type. In this method, when using a solid powder of the starting polymeric fluorescent substance, it may be treated with water and then filtered to remove water or other unnecessary products therefrom.

Examples of method 3) include a method of treating the starting polymeric fluorescent substance in a liquid state by passing through a column filled with a substance that does not contain an acid or an alkali in solid states.

The order of the above steps of treating with an acid, with an alkali, and a substance that does not contain an acid or an alkali can be selected adequately without any particular limitation. In order to attain the sufficient purification effect, the step of treating with an acid is preferably followed by the step of treating with an alkali. More preferably, the step of treating with an acid is followed by the step of treating with an alkali and then by the step of treating with a substance that does not contain an acid or an alkali.

The starting polymeric fluorescent substance to be used in the present invention is fluorescent in a solid state and has a polystyrene equivalent number average molecular weight of $1 \times 10^4$ to $1 \times 10^8$.

The starting polymeric fluorescent substance to be used in the present invention is preferably characterized by being fluorescent in a solid state, having a polystyrene equivalent number average molecular weight of $1 \times 10^4$ to $1 \times 10^8$ and containing at least one repeating unit represented by the following formula (1):

$$—Ar_1—(CR_1=CR_2)_k— \quad (1)$$

wherein $Ar_1$ represents a divalent group that forms carbon-carbon bonds with the adjacent two groups, respectively, which is an arylene group with 6 to 60 carbon atoms on the main chain moiety, or a heterocyclic compound group with 4 to 60 carbon atoms on the main chain moiety, and said arylene group and said heterocyclic compound group may have a substituent; $R_1$ and $R_2$ each independently represent a group selected from the group consisting of a hydrogen atom, an alkyl group with 1 to 20 carbon atoms, an aryl group with 6 to 60 carbon atoms, and a heterocyclic compound group with 4 to 60 carbon atoms and a cyano group; said aryl group and said heterocyclic compound group may have a substituent; and k is 0 or 1.

The starting polymeric fluorescent substance to be used in the present invention is fluorescent in a solid state, has a polystyrene equivalent number average molecular weight of $1\times10^4$ to $1\times10^8$, and preferably contains at least one repeating unit represented by the following formulae (2), (3) and (4), and more preferably contains at least one of each of the repeating units represented by the following formulae (2), (3) and (4).

(2)

wherein $Ar_2$ represents a divalent group that forms carbon-carbon bonds with the adjacent two groups, respectively, which is an arylene group with 6 to 60 carbon atoms on the main chain moiety, or a heterocyclic compound group with 4 to 60 carbon atoms on the main chain moiety; $Ar_2$ may have, other than —X—$R_3$, a substituent selected from the group consisting of an alkyl group with 1 to 20 carbon atoms, an alkoxy group with 1 to 20 carbon atoms, an alkylthio group with 1 to 20 carbon atoms, an alkylsilyl group with 1 to 60 carbon atoms, an alkylamino group with 1 to 40 carbon atoms, an aryl group with 6 to 60 carbon atoms, an aryloxy group with 6 to 60 carbon atoms, an arylalkyl group with 6 to 60 carbon atoms, an arylalkoxy group with 6 to 60 carbon atoms, an arylamino group with 6 to 60 carbon atoms, a heterocyclic compound group with 4 to 60 carbon atoms and a cyano group, wherein said aryl group, aryloxy group, arylalkyl group, arylalkoxy group, arylamino group and heterocyclic compound group may have a further substituent(s); when $Ar_2$ has a plurality of substituents, they may be the same as or different from each other; $R_3$ represents a group selected from the group consisting of an alkyl group with 1 to 20 carbon atoms, an aryl group with 6 to 60 carbon atoms, an arylalkyl group with 7 to 60 carbon atoms, and a heterocyclic compound group with 4 to 60 carbon atoms, wherein said aryl group, arylalkyl group and heterocyclic compound group may have a substituent; X represents the group selected from the group consisting of —O—, —S—, —$CR_6R_7$—, —$SiR_8R_9$—, —$NR_{10}$—, —CO—, —COO—, —$SO_2$—, —$CR_{11}$=$CR_{12}$— and C≡C—; m is an integer of 1 to 4; $R_4$, $R_5$ and $R_6$ to $R_{12}$ represent each independently a group selected from the group consisting of a hydrogen atom, an alkyl group with 1 to 20 carbon atoms, an aryl group with 6 to 20 carbon atoms, a heterocyclic compound group with 4 to 20 carbon atoms and a cyano group, wherein said aryl group and heterocyclic compound group may have a substituent; and n is 0 or 1.

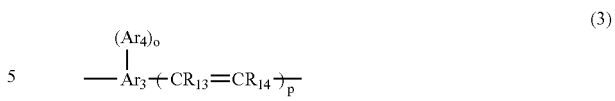
(3)

wherein $Ar_3$ represents a divalent group that forms carbon-carbon bonds with the adjacent two groups, respectively, which is an arylene group with 6 to 60 carbon atoms on the main chain moiety, or a heterocyclic compound group with 4 to 60 carbon atoms on the main chain moiety; the $Ar_3$ may have, other than —$Ar_4$, a substituent selected from the group consisting of an alkyl group with 1 to 20 carbon atoms, an alkoxy group with 1 to 20 carbon atoms, an alkylthio group with 1 to 20 carbon atoms, an alkylsilyl group with 1 to 60 carbon atoms, an alkylamino group with 1 to 40 carbon atoms, an aryl group with 6 to 60 carbon atoms, an aryloxy group with 6 to 60 carbon atoms, an arylalkyl group with 6 to 60 carbon atoms, an arylalkoxy group with 6 to 60 carbon atoms, an arylamino group with 6 to 60 carbon atoms, a heterocyclic compound group with 4 to 60 carbon atoms and a cyano group, wherein said aryl group, aryloxy group, arylalkyl group, arylalkoxy group, arylamino group and heterocyclic compound group may have a further substituent(s); when $Ar_3$ has a plurality of substituents, they may be the same as or different from each other; $Ar_4$ represents an aryl group with 6 to 60 carbon atoms and a heterocyclic compound group with 4 to 60 carbon atoms, and the aryl group and the heterocyclic compound group may have a substituent; o is an integer of 1 to 4; $R_{13}$ and $R_{14}$ represent each independently a hydrogen atom, an alkyl group with 1 to 20 carbon atoms, an aryl group with 6 to 60 carbon atoms, a heterocyclic compound group with 4 to 60 carbon atoms and a cyano group, wherein said aryl group and heterocyclic compound group may have a substituent; and p is 0 or 1.

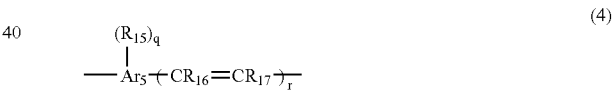
(4)

wherein $Ar_5$ represents a divalent group that forms carbon-carbon bonds with the adjacent two groups, respectively, which is an arylene group with 6 to 60 carbon atoms on the main chain moiety, or a heterocyclic compound group with 4 to 60 carbon atoms on the main chain moiety; the $Ar_5$ may have, other than —$R_{15}$, a substituent selected from the group consisting of an alkyl group with 1 to 20 carbon atoms, an alkoxy group with 1 to 20 carbon atoms, an alkylthio group with 1 to 20 carbon atoms, an alkylsilyl group with 1 to 60 carbon atoms, an alkylamino group with 1 to 40 carbon atoms, an aryl group with 6 to 60 carbon atoms, an aryloxy group with 6 to 60 carbon atoms, an arylalkyl group with 6 to 60 carbon atoms, an arylalkoxy group with 6 to 60 carbon atoms, an arylamino group with 6 to 60 carbon atoms, a heterocyclic compound group with 4 to 60 carbon atoms and a cyano group, wherein said aryl group, aryloxy group, arylalkyl group, arylalkoxy group, arylamino group and heterocyclic compound group may have a further substituent(s); when $Ar_5$ has a plurality of substituents, they may be the same as or different from each other; $R_{15}$ represents an alkyl group with 1 to 20 carbon atoms a cyclic saturated hydrocarbon group with 5 to 16 carbon atoms or a saturated heterocyclic compound group with 4 to 60 carbon atoms, wherein said cyclic saturated hydrocarbon group and saturated heterocyclic compound group may have a substituent; q is an integer of 1 to 4; $R_{16}$ and $R_{17}$ represent each independently a group selected from the group consisting of a hydrogen atom, an alkyl group with 1 to 20 carbon atoms, an aryl group with 6 to 60 carbon atoms, a heterocyclic compound group with 4 to 60 carbon atoms and a cyano group, wherein said aryl group and heterocyclic compound group may have a substituent; and r is 0 or 1.

The starting polymeric fluorescent substance is more preferably such a polymeric fluorescent substance that the total of the repeating units represented by formulae (2), (3) and (4) is 50 mol % of all the repeating units, as well as based on the total of the repeating units represented by formulae (2), (3) and (4), the repeating unit represented by formula (2) is not less than 0.1 mol % to not more than 30 mol %, the repeating unit represented by formula (3) is not less than 30 mol % to not more than 70 mol %, and the repeating unit represented by formula (4) is not less than 30 mol % to not more than 70 mol %. The polymeric fluorescent substance is most preferably such one that the repeating unit represented by formula (2) is not less than 0.2 mol % to not more than 10 mol % based on all the repeating units.

$Ar_1$, $Ar_2$, $Ar_3$ and $Ar_5$ may be selected not to damage the fluorescent property of the polymeric fluorescent substance. The specific examples include the divalent groups listed in the following (5):

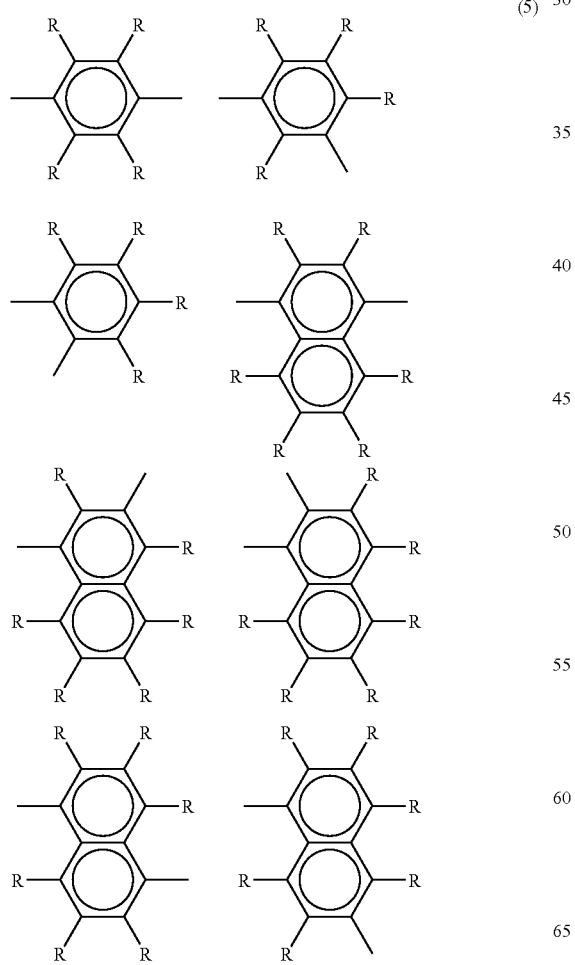

(5)

-continued

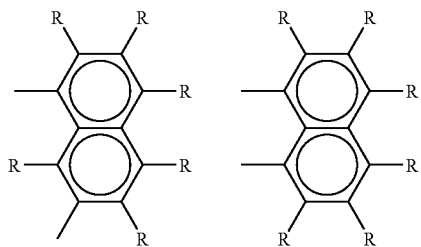

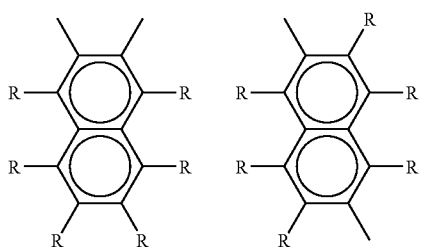

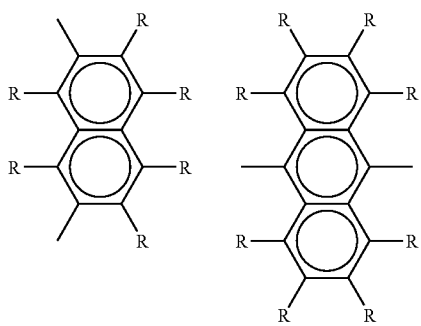

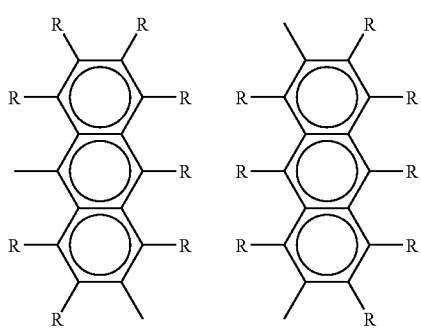

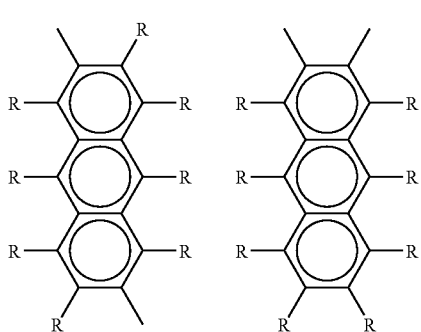

-continued
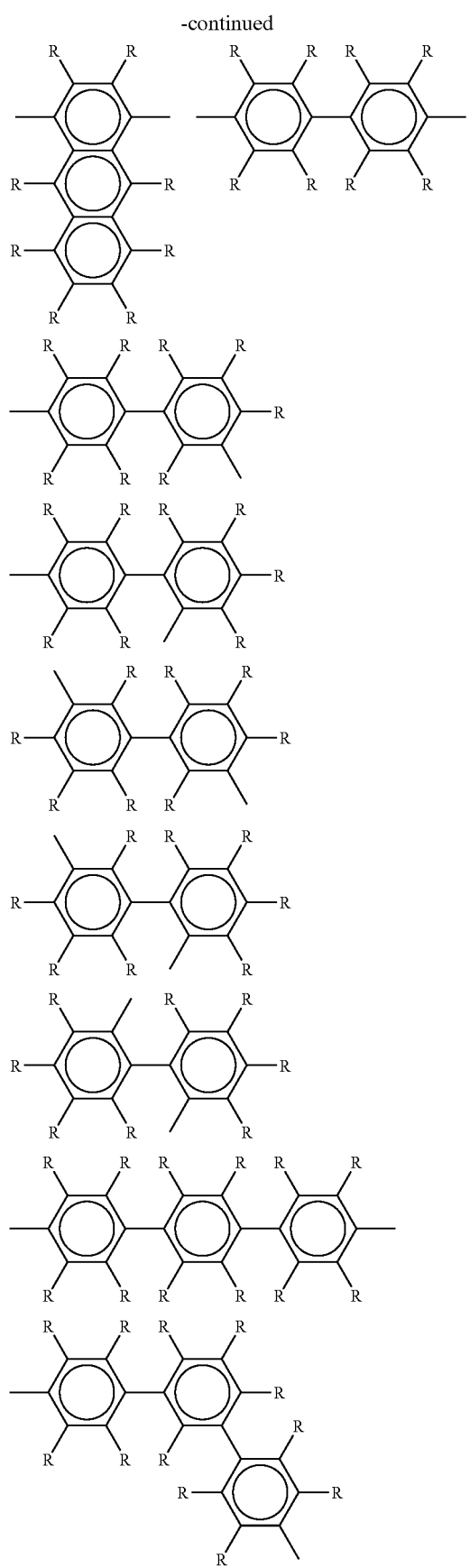
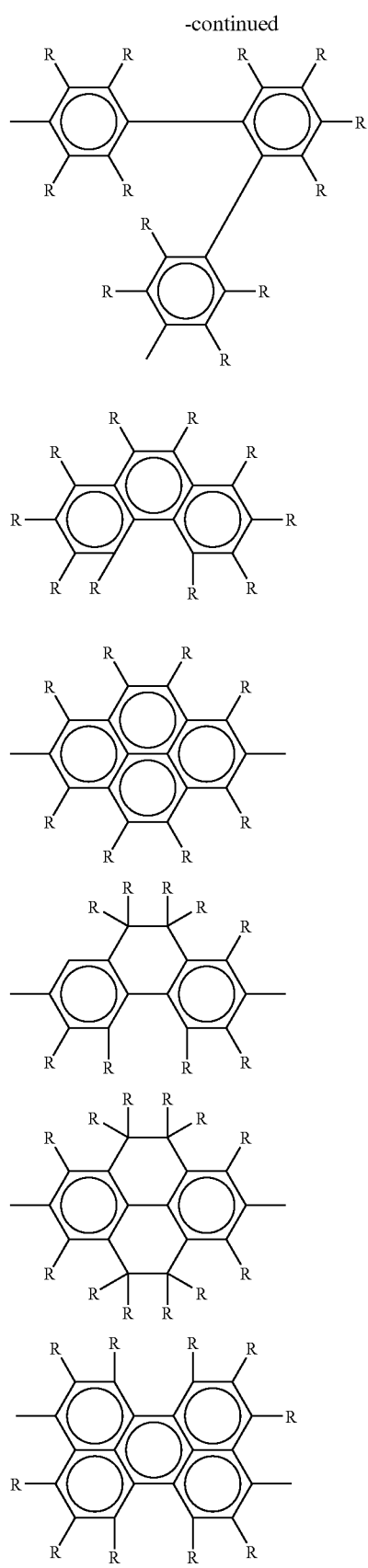

-continued
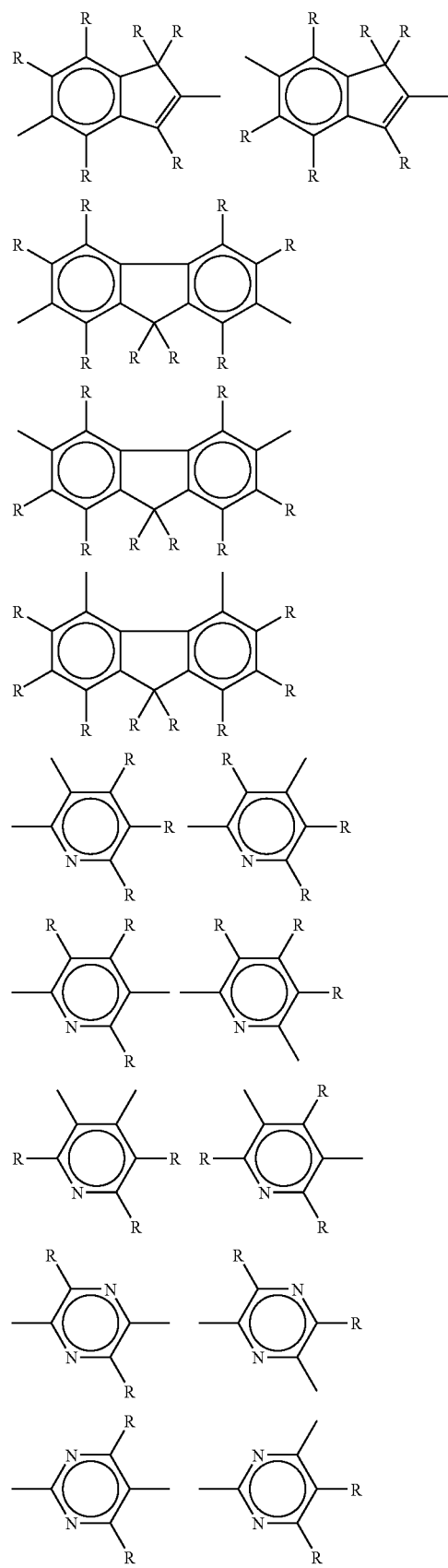
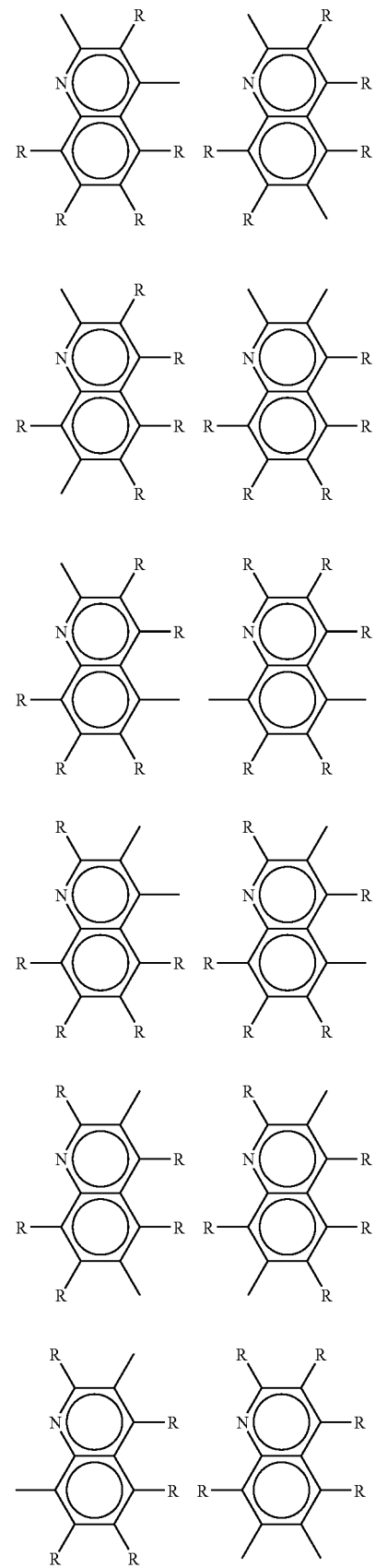

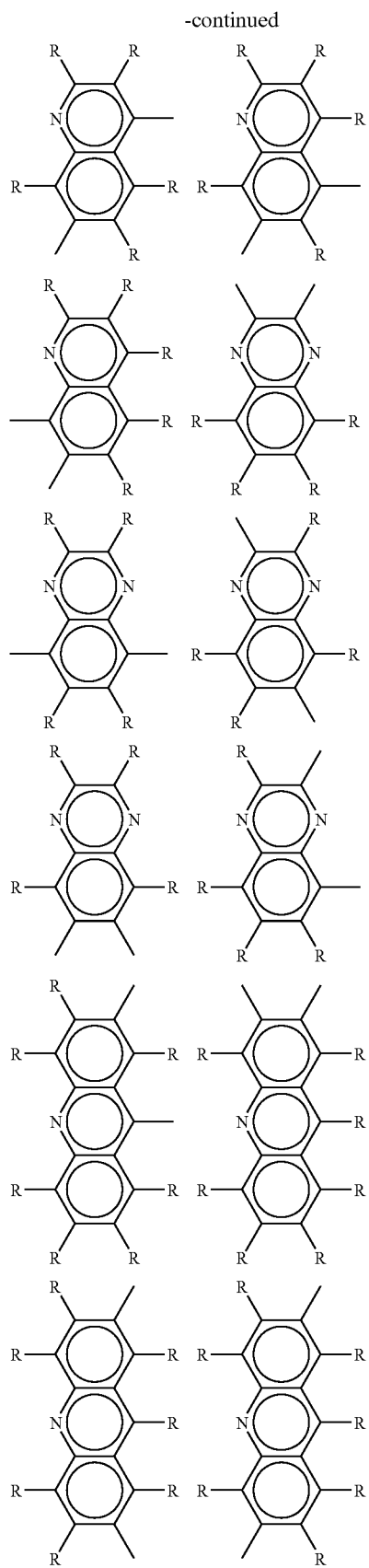
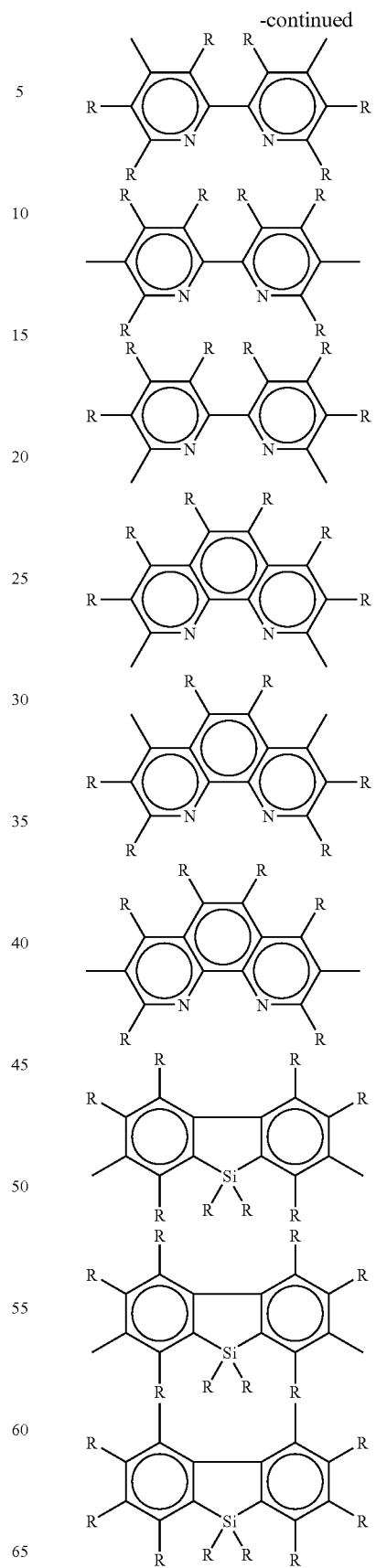

-continued
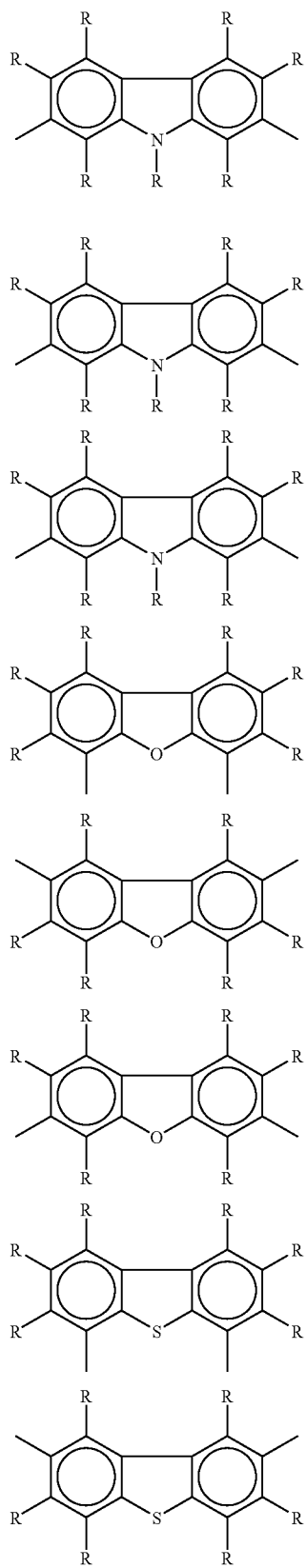
-continued
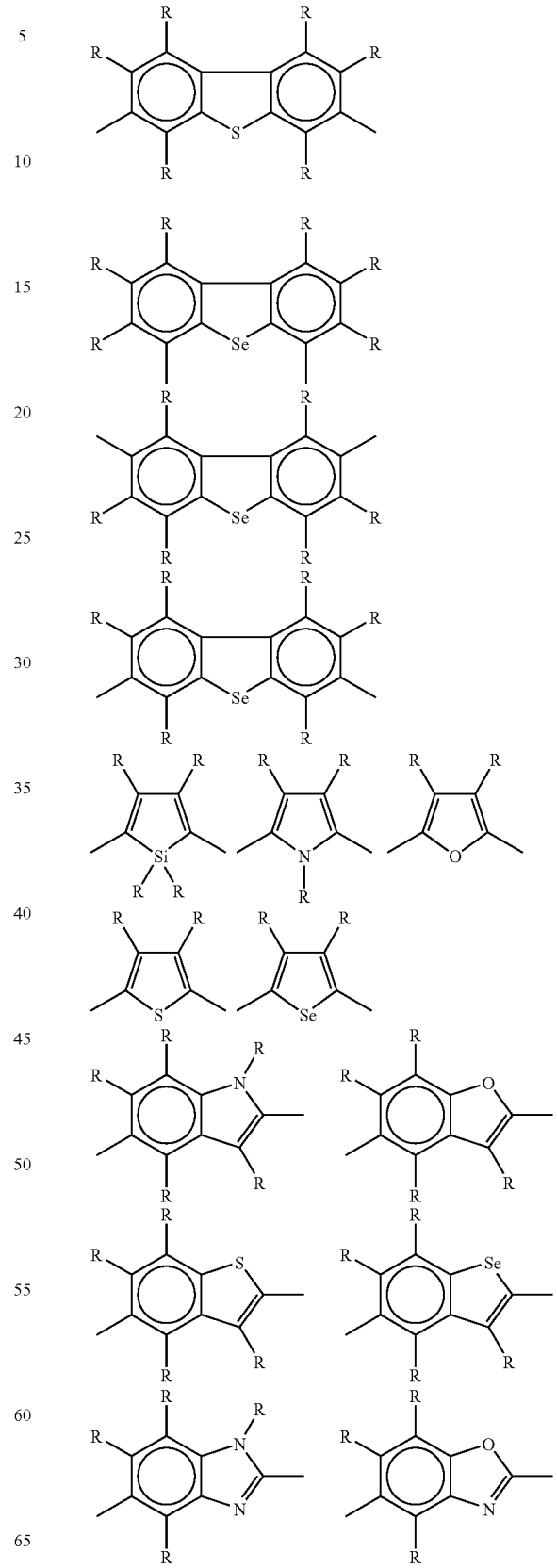

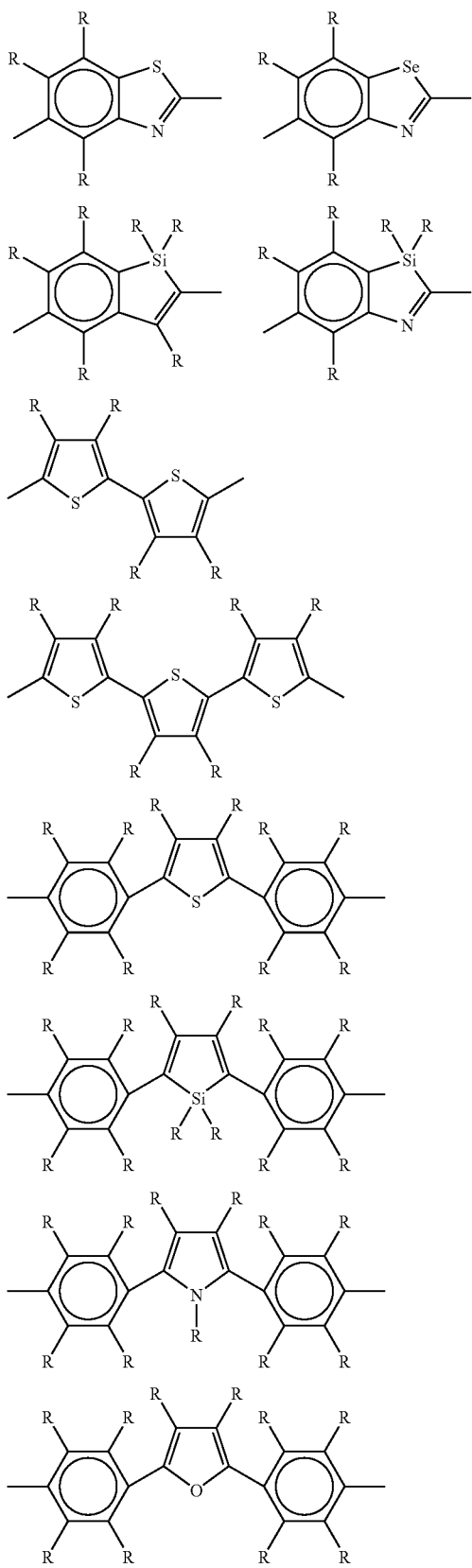

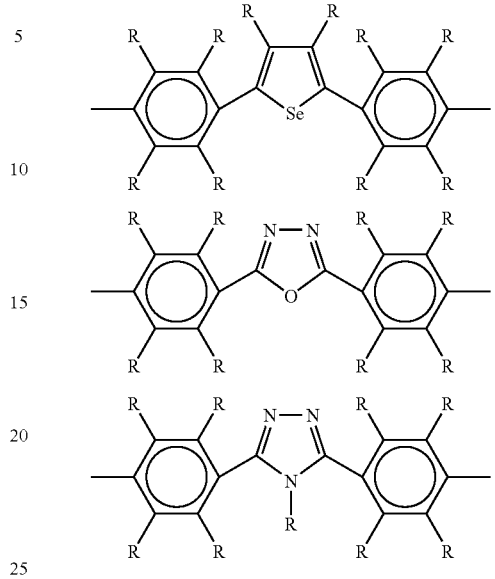

R for Ar$_2$ is selected so that R has 1 to 4 substituents represented by —X—R$_3$, R for Ar$_3$ is selected so that R has 1 to 4 substituents represented by —Ar$_4$, and R for Ar$_5$ is selected so that R has 1 to 4 substituents represented by —R$_3$. The remaining R represents a substituent selected from the group consisting of a hydrogen atom, an alkyl group with 1 to 20 carbon atoms, an alkoxy group with 1 to 20 carbon atoms, an alkylthio group with 1 to 20 carbon atoms, an alkylsilyl group with 1 to 60 carbon atoms, an alkylamino group with 1 to 40 carbon atoms, an aryl group with 6 to 60 carbon atoms, an aryloxy group with 6 to 60 carbon atoms, an arylalkyl group with 6 to 60 carbon atoms, an arylalkoxy group with 6 to 60 carbon atoms, an arylamino group with 6 to 60 carbon atoms, a heterocyclic compound group with 4 to 60 carbon atoms, and a cyano group, wherein the aryl group, the aryloxy group, the arylalkyl group, the arylalkoxy group, the arylamino group, and the heterocyclic compound group may have a further substituent. In the above example, a plurality of Rs in one structural formula may be the same or different groups that are selected each independently. When Ar$_1$ has a plurality of substituents, they may be the same as or different from each other. In order to improve the solubility to a solvent, one or more substituents other than a hydrogen atom is preferably included, and the shape of the repeating unit including the substituents is preferably less symmetric.

X represents a group selected from the group consisting of —O—, —S—, —CR$_6$R$_7$—, —SiR$_8$R$_9$—, —NR$_{10}$—, —CO—, —COO—, —SO$_2$—, —CR$_{11}$=CR$_{12}$— and C≡C—, X is preferably —O—, —S—, —CR$_{11}$=CR$_{12}$— or C≡C— and more preferably —O—. R$_6$ and R$_{12}$ represent each independently a group selected from the group consisting of a hydrogen atom, an alkyl group with 1 to 20 carbon atoms, an aryl group with 6 to 60 carbon atoms, a heterocyclic compound group with 4 to 60 carbon atoms and a cyano group, wherein the aryl group and the heterocyclic compound group may have a further substituent.

Specific examples of R$_3$ and R$_{15}$, as an alkyl group with 1 to 20 carbon atoms, include a methyl group, an ethyl group, a propyl group, a butyl group, a pentyl group, a hexyl group, a heptyl group, an octyl group, a nonyl group, a decyl group and a lauryl group. A pentyl group, a hexyl group, an octyl group and a decyl group are preferred.

Specific examples of $R_3$ and $Ar_4$, as an aryl group with 6 to 60 carbon atoms, include a phenyl group, a $C_1$-$C_{12}$ alkoxyphenyl group ($C_1$-$C_{12}$ indicates the number of carbon atoms being 1 to 12; the same shall be applied hereinafter), a $C_1$-$C_{12}$ alkylphenyl group, a 1-naphthyl group and a 2-naphthyl group. A $C_1$-$C_{12}$ alkoxyphenyl group and a $C_1$-$C_{12}$ alkylphenyl group are preferred.

Specific examples of $R_3$ and $Ar_4$, as an arylalkyl group with 7 to 60 carbon atoms, include a phenylmethyl group, a phenylethyl group, a phenylpropyl group, a $C_1$-$C_{12}$ alkoxyphenylmethyl group, a $C_1$-$C_{12}$ alkoxyphenylethyl group, a $C_1$-$C_{12}$ alkoxyphenylpropyl group, a $C_1$-$C_{12}$ alkylphenylmethyl group, a $C_1$-$C_{12}$ alkylphenylethyl group, a $C_1$-$C_{12}$ alkylphenylpropyl group, a naphthylmethyl group, a naphthylethyl group and a naphthylpropyl group. A $C_1$-$C_{12}$ alkoxyphenylmethyl group, a $C_1$-$C_{12}$ alkoxyphenylethyl group, a $C_1$-$C_{12}$ alkoxyphenylpropyl group, a $C_1$-$C_{12}$ alkylphenylmethyl group, a $C_1$-$C_{12}$ alkylphenylethyl group and a $C_1$-$C_{12}$ alkylphenylpropyl group are preferred.

Specific examples of $R_3$ and $Ar_4$, as a heterocyclic compound group with 4 to 60 carbon atoms, include a thienyl group, a $C_1$-$C_{12}$ alkylthienyl group, a pyrroyl group, a furyl group, a pyridyl group and a $C_1$-$C_{12}$ alkylpyridyl group. A thienyl group, a $C_1$-$C_{12}$ alkylthienyl group, a pyridyl group and a $C_1$-$C_{12}$ alkylpyridyl group are preferred.

Specific examples of $R_{15}$, as a cyclic saturated hydrocarbon group with 5 to 16 carbon atoms, include a cyclopropyl group, a cyclobutyl group, a cyclopentyl group, a cyclohexyl group, a cycloheptyl group, a cyclooctyl group, a cyclononyl group and a cyclododecyl group. A cyclohexyl group is preferred.

Specific examples of $R_{15}$, as a saturated heterocyclic compound group with 4 to 60 carbon atoms, include a tetrahydrofuranyl group, a pyranyl group, a pyrrolidyl group, a piperazyl group, a thioranyl group and a thianyl group. A tetrahydrofuranyl group and a pyranyl group are preferred.

Examples of R wherein it is a substituent other than a hydrogen atom, a cyano group or a group represented by —X—$R_3$, —$Ar_4$ or $R_{15}$ are described below.

Examples of alkyl group with 1 to 20 carbon atoms include a methyl group, an ethyl group, a propyl group, a butyl group, a pentyl group, a hexyl group, a heptyl group, an octyl group, a nonyl group, a decyl group and a lauryl group. A pentyl group, a hexyl group, an octyl group and a decyl group are preferred.

Examples of alkoxy group with 1 to 20 carbon atoms include a methoxy group, an ethoxy group, a propyloxy group, a butoxy group, a pentyloxy group, a hexyloxy group, a heptyloxy group, an octyloxy group, a nonyloxy group, a decyloxy group and a lauryloxy group. A pentyloxy group, a hexyloxy group, an octyloxy group and a decyloxy group are preferred.

Examples of alkylthio group with 1 to 20 carbon atoms include a methylthio group, an ethylthio group, a propylthio group, a butylthio group, a pentylthio group, a hexylthio group, a heptylthio group, an octylthio group, a nonylthio group, a decylthio group and a laurylthio group. A pentylthio group, a hexylthio group, an octylthio group and a decylthio group are preferred.

Examples of alkylsilyl group with 1 to 60 carbon atoms include a trimethylsilyl group, a triethylsilyl group, a tripropylsilyl group, a tributylsilyl group, a tripentylsilyl group, a trihexylsilyl group, a triheptylsilyl group, a trioctylsilyl group, a trinonylsilyl group, a tridecylsilyl group, a trilaurylsilyl group, an ethyldimethylsilyl group, a propyldimethylsilyl group, a butyldimethylsilyl group, a pentyldimethylsilyl group, a hexyldimethylsilyl group, a heptyldimethylsilyl group, an octyldimethylsilyl group, a nonyldimethylsilyl group, a decyldimethylsilyl group and a lauryldimethylsilyl group. A tripentylsilyl group, a trihexylsilyl group, a trioctylsilyl group, a tridecylsilyl group, a pentyldimethylsilyl group, a hexyldimethylsilyl group, an octyldimethylsilyl group and a decyldimethylsilyl group are preferred.

Examples of alkylamino group with 1 to 40 carbon atoms include a methylamino group, an ethylamino group, a propylamino group, a butylamino group, a pentylamino group, a hexylamino group, a heptylamino group, an octylamino group, a nonylamino group, a decylamino group, a laurylamino group, a dimethylamino group, a diethylamino group, a dipropylamino group, a dibutylamino group, a dipentylamino group, a dihexylamino group, a diheptylamino group, a dioctylamino group, a dinonylamino group, a didecylamino group and a dilaurylamino group. A pentylamino group, a hexylamino group, an octylamino group, a decylamino group, a dipentylamino group, a dihexylamino group, a dioctylamino group and a didecylamino group are preferred.

Examples of aryl group with 6 to 60 carbon atoms include a phenyl group, a $C_1$-$C_{12}$ alkoxyphenyl group ($C_1$-$C_{12}$ indicates the number of carbon atoms being 1 to 12; the same shall be applied hereinafter), a $C_1$-$C_{12}$ alkylphenyl group, a 1-naphthyl group and a 2-naphthyl group. A $C_1$-$C_{12}$ alkoxyphenyl group and a $C_1$-$C_{12}$ alkylphenyl group are preferred.

Examples of aryloxy group with 6 to 60 carbon atoms include a phenoxy group, a $C_1$-$C_{12}$ alkoxyphenoxy group, a $C_1$-$C_{12}$ alkylphenoxy group, a 1-naphthyloxy group and a 2-naphthyloxy group. A $C_1$-$C_{12}$ alkoxyphenoxy group and a $C_1$-$C_{12}$ alkylphenoxy group are preferred.

Examples of arylalkyl group with 6 to 60 carbon atoms include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group and a 2-naphthyl-$C_1$-$C_{12}$ alkyl group. A $C_1$-$C_{12}$ alkoxyphenyl-$C_1$-$C_{12}$ alkyl group and a $C_1$-$C_{12}$ alkylphenyl-$C_1$-$C_{12}$ alkyl group are preferred.

Examples of arylalkoxy group with 6 to 60 carbon atoms include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphtyl-$C_1$-$C_{12}$ alkoxy group and 2-naphthyl-$C_1$-$C_{12}$ alkoxy group. A $C_1$-$C_{12}$ alkoxyphenyl-$C_1$-$C_{12}$ alkoxy group and a $C_1$-$C_{12}$ alkylphenyl-$C_1$-$C_{12}$ alkoxy group are preferred.

Examples of arylamino group with 6 to 60 carbon atoms include a phenylamino group, a diphenylamino group, a $C_1$-$C_{12}$ alkoxyphenylamino group, a di($C_1$-$C_{12}$ alkoxyphenyl)amino group, a di($C_1$-$C_{12}$ alkylphenyl)amino group, a 1-naphthylamino group and a 2-naphthylamino group. A $C_1$-$C_{12}$ alkylphenylamino group and a di($C_1$-$C_{12}$ alkylphenyl)amino group are preferred.

Examples of heterocyclic compound group with 4 to 60 carbon atoms include a thienyl group, a $C_1$-$C_{12}$ alkylthienyl group, a pyrrolyl group, a furyl group, a pyridyl group and a $C_1$-$C_{12}$ alkylpyridyl group. A thienyl group, a $C_1$-$C_{12}$ alkylthienyl group, a pyridyl group and a $C_1$-$C_{12}$ alkylpyridyl group are preferred.

Among the examples of R, the substituents containing an alkyl chain may be straight, branched, cyclic or a combination thereof. In the case other than straight, the examples include an isoamyl group, a 2-ethylhexyl group, a 3,7- dimethyloctyl group, a cyclohexyl group and a 4-$C_1$-$C_{12}$ alkylcyclohexyl group. In order to improve the solubility of the polymeric fluorescent substance to a solvent, one or more substituents of $Ar_1$, $Ar_2$, $Ar_3$ and $Ar_5$ preferably contain an alkyl chain that is cyclic or branched.

In the above formula (1), k is 0 or 1; in the above formula (2), n is 0 or 1; in the above formula (3), p is 0 or 1; and in the above formula (4), r is 0 or 1. $R_1$ and $R_2$ of the above formula (1), $R_4$ and $R_5$ of the above formula (2), $R_{13}$ and $R_{14}$ of the above formula (3), $R_{16}$ and $R_{17}$ of the above formula (4), and the above $R_6$ to $R_{12}$ represent each independently a group selected from the group consisting of a hydrogen atom, an alkyl group with 1 to 20 carbon atoms, an aryl group with 6 to 60 carbon atoms, a heterocyclic compound group with 4 to 60 carbon atoms and a cyano group. The aryl group and the heterocyclic compound group may have a substituent.

Examples of $R_1$, $R_2$, $R_4$ to $R_{14}$, $R_{16}$ and $R_{17}$, wherein they are a substituent other than a hydrogen atom or a cyano group, are described below. Examples of alkyl group with 1 to 20 carbon atoms include a methyl group, an ethyl group, a propyl group, a butyl group, a pentyl group, a hexyl group, a heptyl group, an octyl group, a nonyl group, a decyl group and a lauryl group. A methyl group, an ethyl group, a pentyl group, a hexyl group, a heptyl group and an octyl group are preferred.

Examples of aryl group with 6 to 60 carbon atoms include a phenyl group, a $C_1$-$C_{12}$ alkoxyphenyl group, a $C_1$-$C_{12}$ alkylphenyl group, a 1-naphthyl group and a 2-naphthyl group. A phenyl group and a $C_1$-$C_{12}$ alkylphenyl group are preferred.

Examples of heterocyclic compound group with 4 to 60 carbon atoms include a thienyl group, a $C_1$-$C_{12}$ alkylthienyl group, a pyrrolyl group, a furyl group, a pyridyl group, and a $C_1$-$C_{12}$ alkylpyridyl group. A thienyl group, a $C_1$-$C_{12}$ alkylthienyl group, a pyridyl group and a $C_1$-$C_{12}$ alkylpyridyl group are preferred.

Moreover, the terminal group of the polymeric fluorescent substance may be protected by a stable group because a polymerizable group that remains as it is at the terminal group may lower the light emitting property or life of a device made-therefrom. The terminal group preferably has a conjugated bond continuous with the conjugated structure of the main chain. A structure bonded with an aryl group or heterocyclic compound group via a vinylene group is mentioned for example. The specific example is the substituent described in Compound 10 of JP-A-9-45478.

An example of method for synthesizing the starting polymeric fluorescent substance that has a vinylene group in the main chain is, for example, JP-A-5-202355 or the like. That is, mention may be made of, for example, polymerization by a Wittig reaction between a dialdehyde compound and a diphosphonium salt compound; polymerization by a Heck reaction between a divinyl compound and a dihalogen compound or between vinyl halogen compounds alone; polymerization by a Horner-Wadsworth-Emmons method between a dialdehyde compound and a diphosphite compound; polycondensation by a dehydrohalogenation method of a compound having two halogenated methyl groups; polycondensation by a sulfonium salt decomposition method of a compound having two sulfonium salt groups; polymerization by a Knoevenagel reaction between a dialdehyde compound and a diacetonitrile compound; and polymerization by a McMurry reaction of a dialdehyde compound.

In case the main chain does not have a vinylene group, mention may be made of polymerization from a corresponding monomer by a Suzuki coupling reaction; polymerization by a Grignard reaction; method of polymerization by a Ni(0) catalyst; polymerization by an oxidant such as $FeCl_3$; electrochemical oxidation polymerization; or decomposition of an intermediate polymer having an appropriate leaving group.

Further, the starting polymeric fluorescent substance and the polymeric fluorescent substance produced by the method of the present invention may include other repeating units than the repeating unit represented by formulas (1), (2), (3) and (4) unless the fluorescence property or charge transport property is damaged. Furthermore, the repeating unit represented by formulas (1), (2), (3) and (4) and other repeating units may be linked at non-conjugated units. The non-conjugated units may be included in the repeating units. Examples of bind structures include those shown in the following (6), a combination of those shown in the following (6) and a vinylene group and a combination of two or more of those shown in the following (6). Here, R is a group selected from the same substituents as above, and Ar represents a hydrocarbon group having 6 to 60 carbon atoms.

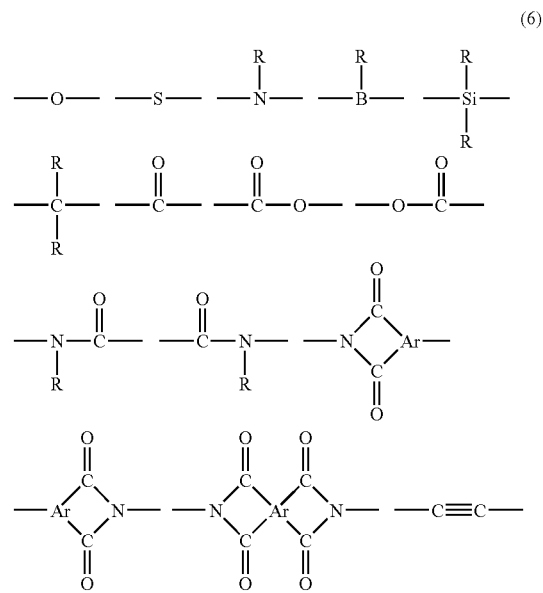

(6)

The polymeric fluorescent substance may be a random, block or graft copolymer, or a polymer having an intermediate structure of them such as a random copolymer having a block property. From a viewpoint to obtain a polymeric fluorescent substance with a high quantum yield of fluorescence, a random copolymer having a block property, block copolymer or graft copolymer is preferred to a complete random copolymer. Those that are branched at the main chain and have 3 or more terminals as well as a dendrimer are also included.

The polymeric fluorescent substance that has fluorescence in a solid state is preferably used because light emission from a thin film is used.

Examples of good solvents for the polymeric fluorescent substance include chloroform, methylene chloride, dichloroethane, tetrahydrofuran, toluene, xylene, mesitylene, tetralin, decalin and n-butylbenzene. The crude polymeric fluorescent substance can be dissolved in these solvents usually in an amount of 0.1 wt % or more, depending on the structure or molecular weight of the polymeric fluorescent substance.

Further, the polymeric fluorescent substance produced by the method of the present invention has a polystyrene equivalent molecular weight of $1\times10^4$ to $1\times10^8$, and the degree of the polymerization may change depending on the repeating structures and the proportion thereof. From the standpoint of film forming property, the total number of the repeating structures is generally preferably 30 to 10,000 and more preferably 50 to 5,000.

When using the polymeric fluorescent substance produced by the method of the present invention as a light emitting material of the polymer LED, the purity influences the light emitting property. Hence, when producing the starting polymeric fluorescent substance, a monomer before polymerization is preferably purified by distillation, sublimation purification, recrystallization or the like, and then polymerized. Moreover, in the step of producing the starting polymeric fluorescent substance or in the present invention, the polymeric fluorescent substance is preferably subjected to a purification treatment such as reprecipitation/purification, fractionation by chromatography or the like.

Next, the polymer LED of the present invention will be described below.

The structure of the polymer LED of the present invention includes a light emitting layer between a pair of electrodes consisting of an anode and a cathode at least one of which is transparent or semitransparent. The polymeric fluorescent substance of the present invention is included in the light emitting layer.

Further, examples of the polymer LED of the present invention include a polymer LED having an electron transport layer between a cathode and a light emitting layer, a polymer LED having a hole transport layer between an anode and a light emitting layer, and a polymer LED having an electron transport layer between a cathode and a light emitting layer and having a hole transport layer between an anode and a light emitting layer.

For example, the specific examples include the following structures of a) to d):

a) anode/light emitting layer/cathode
b) anode/hole transport layer/light emitting layer/cathode
c) anode/light emitting layer/electron transport layer/cathode
d) anode/hole transport layer/light emitting layer/electron transport layer/cathode
wherein "/" indicates that each layer is laminated adjacent to each other: the same shall be applied hereinafter.

In the above, the light emitting layer is a layer having a light emitting function; the hole transport layer is a layer having a hole transport function; and the electron transport layer is a layer having an electron transport function. The electron transport layer and the hole transport layer are generically referred to as a charge transport layer. The light emitting layer, the hole transport layer and the electron transport layer may each independently comprise 2 or more layers.

In particular, among the charge transport layers provided adjacent to an electrode, a layer having a function to improve charge injection efficiency from an electrode and an effect to lower the drive voltage of a device is sometimes generally referred to as a charge injection layer (hole injection layer, electron injection layer).

Further, in order to improve cohesion to an electrode or to inject a charge from an electrode, the above charge injection layer or an insulating layer of a film thickness of 2 nm or less may be provided adjacent to an electrode, and in order to improve cohesion between interfaces or to prevent admixture, a thin buffer layer may be inserted to an interface of the charge transport layer or light emitting layer.

The order and the number of the layers to be laminated, and the thickness of each layer can be determined properly by taking into account luminous efficiency and a device life.

In the present invention, examples of the polymer LED provided with a charge injection layer (electron injection layer, hole injection layer) include a polymer LED provided with a charge injection layer adjacent to a cathode and a polymer LED provided with a charge injection layer adjacent to an anode.

The specific examples include the following structures of e) to p):

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transport layer/light emitting layer/cathode
i) anode/hole transport layer/light emitting layer/charge injection layer/cathode
j) anode/charge injection layer/hole transport layer/light emitting layer/charge injection layer/cathode
k) anode/charge injection layer/light emitting layer/electron transport layer/cathode
l) anode/light emitting layer/electron transport layer/charge injection layer/cathode
m) anode/charge injection layer/light emitting layer/electron transport layer/charge injection layer/cathode
n) anode/charge injection layer/hole transport layer/light emitting layer/electron transport layer/cathode
o) anode/hole transport layer/light emitting layer/electron transport layer/charge injection layer/cathode
p) anode/charge injection layer/hole transport layer/light emitting layer/electron transport layer/charge injection layer/cathode Specific examples of the charge injection layer include a layer containing a conducting polymer; a layer provided between an anode and a hole transport layer and containing a material with an ionization potential of an intermediate value between that of an anode material and that of a hole transport material contained in a hole transport layer; and a layer provided between a cathode and an electron transport layer and containing a material with an electron affinity of an intermediate value between that of a cathode material and that of an electron transport material contained in an electron transport layer.

When the above charge injection layer is a layer containing a conducting polymer, the electrical conductivity of the conducting polymer is preferably not less than $10^{-5}$ S/cm to not more than $10^3$ S/cm, in order to reduce the leak current between light emitting pixels, more preferably not less than $10^{-5}$ S/cm to not more than $10^2$ S/cm, and further preferably not less than $10^{-5}$ S/cm to not more than $10^1$ S/cm.

In order to give the electrical conductivity of not less than $10^{-5}$ S/cm to not more than $10^3$ S/cm to the above conducting polymer, it is usually doped with an appropriate amount of ions.

The types of ions to be doped with are an anion for a hole injection layer and a cation for an electron injection layer. Examples of anion include a polystyrene sulfonic acid ion, an alkyl benzene sulfonic acid ion and a camphor sulfonic acid ion. Examples of cation include a lithium ion, a sodium ion, a potassium ion and a tetrabutyl ammonium ion.

The thickness of the carrier injection layer is, for example, 1 nm to 100 nm, and preferably 2 nm to 50 nm.

The material to be used for the electron injection layer may be selected properly depending on the materials of an electrode or a layer adjacent thereto. The examples include: polyaniline and derivatives thereof; polythiophene and derivatives thereof; polypyrrole and derivatives thereof; polyphenylene vinylene and derivatives thereof; polythienylene vinylene and derivatives thereof; polyquinoline and derivatives thereof; polyquinoxaline and derivatives thereof; a conducting polymer such as a polymer containing an aromatic amine structure in the main chain or a side chain; a metal phthalocyanine (such as copper phthalocyanine); and carbon.

The insulating layer with a thickness of 2 nm or less has a function to facilitate charge injection. Examples of the material for the above insulating layer include a metal fluoride, a metal oxide and an organic insulating material. Examples of polymer LED provided with the insulating layer with a thickness of 2 nm or less include a polymer LED provided with an insulating layer with a thickness of 2 nm or less adjacent to a cathode and a polymer LED provided with an insulating layer with a thickness of 2 nm or less adjacent to an anode.

The specific examples include the following structures of q) to ab):

q) anode/insulating layer with a thickness of 2 nm or less/light emitting layer/cathode r) anode/light emitting layer/insulating layer with a thickness of 2 nm or less/cathode s) anode/insulating layer with a thickness of 2 nm or less/light emitting layer/insulating layer with a thickness of 2 nm or less/cathode t) anode/insulating layer with a thickness of 2 nm or less/hole transport layer/light emitting layer/cathode u) anode/hole transport layer/light emitting layer/insulating layer with a thickness of 2 nm or less/cathode v) anode/insulating layer with a thickness of 2 nm or less/hole transport layer/light emitting layer/insulating layer with a thickness of 2 nm or less/cathode w) anode/insulating layer with a thickness of 2 nm or less/light emitting layer/electron transport layer/cathode x) anode/light emitting layer/electron transport layer/insulating layer with a thickness of 2 nm or less/cathode y) anode/insulating layer with a thickness of 2 nm or less/light emitting layer/electron transport layer/insulating layer with a thickness of 2 nm or less/cathode z) anode/insulating layer with a thickness of 2 nm or less/hole transport layer/light emitting layer/electron transport layer/cathode aa) anode/hole transport layer/light emitting layer/electron transport layer/insulating layer with a thickness of 2 nm or less/cathode ab) anode/insulating layer with a thickness of 2 nm or less/hole transport layer/light emitting layer/electron transport layer/insulating layer with a thickness of 2 nm or less/cathode It is very advantageous in producing the polymer LED to use these polymeric fluorescent substances soluble in organic solvents: when forming a film from a solution, only drying and removing the solvent is required after coating; and also when mixed with a charge transport material and a light emitting material, the same technique can be applied. Examples of method of forming a film from a solution include coating methods such as a spin coating method, a casting method, a microgravure coating method, a gravure coating method, a bar coating method, a roll coating method, a wire bar coating method, a dip coating method, a spray coating method, a screen printing method, a flexoprinting method, an offset printing method and an ink jet printing method.

The optimum value of thickness of the light emitting layer varies depending on a material used and may be selected so as to have optimum values of drive voltage and light emitting efficiency. It is, for example, 1 nm to 1 μm, preferably 2 nm to 500 nm and more preferably 5 nm to 200 nm.

In the polymer LED of the present invention, a light emitting material other than the above polymeric fluorescent substance may be mixed and used in the light emitting material. Further, in the polymer LED of the present invention, a light emitting layer containing a light emitting material other than the above polymeric fluorescent substance may be laminated with a light emitting layer containing the above polymeric fluorescent substance.

Known light emitting materials can be used as the above light emitting material. Among low molecular weight compounds, the examples that can be used include a naphthalene derivative; anthracene or derivatives thereof; perylene or derivatives thereof; a dye such as polymethine, xanthene, coumarin and cyanine; a metal complex of 8-hydroxyquinoline or derivatives thereof; an aromatic amine; a tetraphenylcyclopentadiene or derivatives thereof; and a tetraphenylbutadiene or derivatives thereof.

The specific examples that can be used include known ones such as those described in JP-A-57-51781 and JP-A-59-194393.

When the polymer LED of the present invention has a hole transport layer, examples of the hole transport material that is used include polyvinylcarbazole or derivatives thereof; polysilane or derivatives thereof; a polysiloxane derivative having an aromatic amine on a side chain or the main chain; a pyrazoline derivative; an arylamine derivative; a stilbene derivative; a triphenyldiamine derivative; polyaniline or derivatives thereof; polythiophene or derivatives thereof; polypyrrole or derivatives thereof; poly(p-phenylene vinylene) or derivatives thereof; and poly(2,5-thienylene vinylene) or derivatives thereof.

Specific examples of hole transport material include those described in JP-A-63-70257, JP-A-63-175860, JP-A-2-135359, JP-A-2-135361, JP-A-2-209988, JP-A-3-37992 and JP-A-3-152184.

Among them, the hole transport material for the hole transport layer is preferably a polymeric hole transport material such as polyvinylcarbazole or derivatives thereof; polysilane or derivatives thereof; a polysiloxane derivative having an aromatic amine compound group on a side chain or the main chain; polyaniline or derivatives thereof; polythiophene or derivatives thereof; poly(p-phenylene vinylene) or derivatives thereof; or poly(2,5-thienylene vinylene) or derivatives thereof, more preferably polyvinylcarbazole or derivatives thereof; polysilane or derivatives thereof; or a polysiloxane derivative having aromatic amine on a side chain or the main chain. For a low molecular weight hole transport material, it is preferably dispersed in a polymer binder.

Polyvinylcarbazole or derivatives thereof can be obtained by cation polymerization or radial polymerization from, for example, a vinyl monomer.

Examples of polysilane or derivatives thereof include compounds described in Chem. Rev., Vol. 89, p. 1359 (1989)

and British Patent GB2300196. For the synthesis thereof, the method described in the publication can be also used, but a Kipping method is preferably used.

Polysiloxane or derivatives thereof having a structure of the above low molecular weight hole transport material on the side chain or the main chain is preferably used because the skeletal structure of siloxane hardly has a hole transport property. In particular, the example is the one having an aromatic amine with a hole transport property on a side chain or the main chain.

There is no limitation to method for forming a film of the hole transport layer. For a low molecular weight hole transport material, a film forming from a solution mixed with a polymer binder is mentioned for example. For a high molecular weight hole transport material, a film forming from a solution is mentioned for example.

Any solvent that dissolves the hole transport material may be used as a solvent for film forming from a solution without any particular limitation. Examples of the solvent include a chlorine-containing solvent such as chloroform, methylene chloride or dichloroethane, an ether solvent such as tetrahydrofuran, an aromatic hydrocarbon solvent such as toluene, xylene, a ketone solvent such as acetone, methyl ethyl ketone, and an ester solvent such as ethyl acetate, butyl acetate, ethyl celosolve acetate.

For film forming from a solution, an application method from a solution can be used, that is: a spin coating method, a casting method, a microgravure coating method, a gravure coating method, a bar coating method, a roll coating method, a wire bar coating method, a dip coating method, a spray coating method, a screen printing method, a flexoprinting method, an offset printing method and an ink jet printing method.

For the polymer binder to be mixed, preferably used is those that do not extremely inhibit a charge transport and also those that do not strongly absorb visible light. Examples of the polymer binder include polycarbonate, polyacrylate, polymethylacrylate, polymethylmethacrylate, polystyrene, polyvinyl chloride and polysiloxane.

The optimum value of thickness of the hole transport layer varies depending on a material to be used, but may be selected so that the drive voltage and the luminous efficiency have appropriate values. However, it needs at least a thickness that does not occur a pinhole, but too a thick film increases the drive voltage of the device, which is not preferable. Therefore, the thickness of the hole transport layer is, for example, 1 nm to 1 µm, preferably 2 nm to 500 nm and more preferably 5 nm to 200 nm.

When the polymer LED of the present invention has an electron transport layer, a known material can be used as an electron transport material. The examples include an oxadiazole derivative; anthraquinodimethane or derivatives thereof; benzoquinone or derivatives thereof; naphthoquinone or derivatives thereof; anthraquinone or derivatives thereof; tetracyanoanthraquinodimethane or derivatives thereof; a fluorenone derivative; diphenyldicyanoethylene or derivatives thereof; a diphenoquinone derivative; 8-hydroxyquinoline or a metal complex with a derivative thereof; polyquinoline or derivatives thereof; polyquinoxaline or derivatives thereof; polyfluorene or derivatives thereof.

The specific examples include those described in JP-A-63-70257, JP-A-63-175860, JP-A-2-135359, JP-A-2-135361, JP-A-2-209988, JP-A-3-37992 and JP-A-3-152184.

Among them, preferred are an oxadiazole derivative; benzoquinone or derivatives thereof; anthraquinone or derivatives thereof; 8-hydroxyquinoline or a metal complex with a derivative thereof; polyquinoline or derivatives thereof; polyquinoxaline or derivatives thereof; and polyfluorene or derivatives thereof, and more preferred are 2-(4-biphenylyl)-5-(4-t-butylphenyl)-1,3,4-oxadiazole, benzoquinone, anthraquinone, tris(8-quinolinol)aluminum, and polyquinoline.

There is no special limitation to method for forming an electron transport layer. However, for a low molecular weight electron transport material, vacuum deposition from a powder or forming of a film from a solution or a melt state is mentioned for example. For a high molecular weight electron transport material, forming of a film from a solution or a melt state is mentioned for example. When forming a film from a solution or a melt state, a polymer binder may be used together.

Any solvent that can dissolve an electron transport material and/or a polymer binder may be used in forming a film from a solution without special limitation. Examples of the solvent include a chlorine-containing solvent such as chloroform, methylene chloride, dichloroethane; an ether solvent such as tetrahydrofuran; an aromatic hydrocarbon solvent such as toluene, xylene; a ketone solvent such as acetone, methyl ethyl ketone; an ester solvent such as ethyl acetate, butyl acetate, ethyl celosolve acetate.

Examples of method for forming a film from a solution or a melt state include application methods such as a spin coating method, a casting method, a microgravure coating method, a gravure coating method, a bar coating method, a roll coating method, a wire bar coating method, a dip coating method, a spray coating method, a screen printing method, a flexoprinting method, an offset printing method and an ink jet printing method.

For the polymer binder to be mixed, preferably used is those that do not extremely inhibit charge transport and also those that do not strongly absorb visible light. Examples of the polymer binder include poly(N-vinylcarbazole); polyaniline or derivatives thereof; polythiophene or derivatives thereof; poly(p-phenylene vinylene) or derivatives thereof; poly(2,5-thienylene vinylene) or derivatives thereof; polycarbonate; polyacrylate; polymethylacrylate; polymethylmethacrylate; polystyrene; polyvinyl chloride; and polysiloxane.

The optimum value of thickness of an electron transport layer varies depending on a material used and may be selected so that the drive voltage and the light emitting efficiency have appropriate values. However, it needs at least a thickness that does not occur a pinhole, but too a thick film increases the drive voltage of the device, which is not preferable. Therefore, the thickness of the electron transport layer is, for example, 1 nm to 1 µm, preferably 2 nm to 500 nm and more preferably 5 nm to 200 nm.

Any substrate that forms an electrode and does not change when forming an organic layer may form the polymer LED of the present invention. The examples include glass, plastics, a polymer film and a silicon substrate. For an opaque substrate, the opposite electrode is preferably transparent or semitransparent.

In the present invention, the anode side is preferably transparent or semitransparent. However, the material for the anode is a conductive metal oxide film, a semitransparent metal thin film or the like. The specific examples include indium oxide; zinc oxide; tin oxide; a complex of them, namely indium/tin/oxide (ITO); a film formed by use of conductive glass comprising indium/zinc/oxide and the like (NESA and the like); gold; platinum; silver; copper; and the like. ITO, indium/zinc/oxide and tin oxide are preferred. Examples of the production methods include a vacuum deposition method, a sputtering method, an ion plating method and a plating method. The anode may be an organic transparent conductive film of polyaniline or derivatives thereof, polythiophene or derivatives thereof or the like.

The thickness of the anode can be appropriately selected taking into account light permeability and electrical conductivity, and is, for example, 10 nm to 10 μm, preferably 20 nm to 1 μm and more preferably 50 nm to 500 nm.

Further, in order to facilitate charge injection, a film comprising a phthalocyanine derivative, a conducting polymer, carbon or the like; or a layer of an average thickness of 2 nm or less comprising a metal oxide, a metal fluoride, an organic insulating material or the like may be provided on an anode.

The material of cathode used for the polymer LED of the present invention is preferably a material with a low work function. The examples include metals such as lithium, sodium, potassium, rubidium, cesium, beryllium, magnesium, calcium, strontium, barium, aluminum, scandium, vanadium, zinc, yttrium, indium, cerium, samarium, europium, terbium and ytterbium; an alloy of two or more of them; an alloy of one or more of them with one or more of gold, silver, platinum, copper, manganese, titanium, cobalt, nickel, tungsten and tin; graphite or a graphite intercalation compound. Examples of the alloy include a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy. The cathode may have a laminated structure of two or more layers.

The thickness of the cathode can be appropriately selected taking into account electrical conductivity and durability, and is, for example, 10 nm to 10 μm, preferably 20 nm to 1 μm and more preferably 50 nm to 500 nm.

The method for producing the cathode is a vacuum deposition method, a sputtering method or a laminating method for heat press depositing a metal thin film. Further, a layer comprising a conducting polymer or a layer of an average film thickness of 2 nm or less comprising a metal oxide, a metal fluoride, an organic insulating material or the like may be provided between a cathode and an organic layer. After making a cathode, a protection layer to protect the polymer LED may be attached. In order to stably use the polymer LED for a long time, it is preferable to attach a protection layer and/or a protection cover for protecting the device from the outside.

For the protection layer, a polymer compound, a metal oxide, a metal fluoride, a metal boride or the like may be used. Further, the protection cover may be a glass plate or a plastic plate having its surface subjected to a low water permeation treatment. A method of laminating the cover with a device substrate by a heat cured resin or light cured resin and sealing the assembly is preferably used. The device can be easily prevented from being damaged by keeping a clearance by use of a spacer. Oxidation of the cathode can be prevented by enclosing an inert gas such as nitrogen or argon in the clearance. Moreover, provision of a desiccant such as barium oxide in the clearance can make it easy to prevent the moisture adsorbed in the production step from damaging the device. Any one or more measures described above may be preferably taken.

To obtain two-dimensional light emission using the polymer LED of the present invention, sheet-shaped anode and cathode may be arranged to overlap to each other. Moreover, examples of method for obtaining patterned light emission include: a method of arranging a mask provided with patterned window(s) on the surface of the above sheet-shaped light emitting device; a method for forming an organic layer of the non-light emitting part thick to make itself substantially not light emissible; and a method for forming either an anode or a cathode or both of them in patterned forms. A segment type display device that can display numerals, letters, simple symbols and the like can be obtained by forming patterns by any of these methods and arranging some electrodes so that they can be independently turned ON/OFF. Further, a dot matrix device can be obtained by forming both an anode and a cathode in stripe and arranging them orthogonally. A partial color display and a multicolor display can be obtained by partially arranging plural kinds of polymeric fluorescent substances that emit light in different colors or by using a color filter or a fluorescence conversion filter. The dot matrix device can be driven by a passive drive or active drive in combination with TFT and the like. These display devices can be used as a display device such as a computer, a television, a mobile terminal, a mobile phone, a car navigator and a viewfinder of a video camera.

Moreover, the above sheet-shaped light emitting device is of a thin self-emission type and can be preferably used as a sheet-shaped light source for a backlight of a liquid crystal display device or as a sheet-shaped light source for illumination. When using a flexible substrate, it can also be used as a curved light source or display device.

The present invention will be described below in further detail with reference to Examples, but the present invention will not limited thereto.

Here, with respect to a number average molecular weight, a polystyrene equivalent number average molecular weight was obtained by gel permeation chromatography (GPC) using chloroform as a solvent.

EXAMPLE 1

<Synthesis of Polymeric Fluorescent Substance (1)>

Twelve grams of 2,5-bis(chloromethyl)-4'-(3,7-dimethyloctyloxy)biphenyl and 0.2 g of 2-methoxy-5-(2-ethylhexyloxy)-p-xylylene dichloride were dissolved in 2,100 g of dehydrated 1,4-dioxane. The resulting solution was bubbled by nitrogen for 20 minutes to substitute the system with nitrogen and then heated to 95° C. in a nitrogen atmosphere. To the solution, a solution prepared by dissolving 15.5 g of potassium tert-butoxide in 210 g of dehydrated 1,4-dioxane was added dropwise over about 10 minutes. After the dropwise addition, the mixture was warmed at 97° C. for 2.5 hours to conduct polymerization.

After the polymerization, the solution was cooled to 50° C. and neutralized with acetic acid added. After cooling to room temperature, the polymerization solution was poured into 2,500 g of ion exchange water, and the produced precipitate was collected. The precipitate was washed with methanol and then dried under a reduced pressure. The resultant polymer (7 g) was dissolved in 1,500 g of THF. The solution was poured into 2,000 g of methanol, and the produced precipitate was collected. The precipitate was washed with ethanol and then dried under a reduced pressure to obtain 5 g of a polymer. The polymer is referred to as polymeric fluorescent substance (1).

<Synthesis of Purified Polymeric Fluorescent Substance 2>

Example of Washing with Acid

Operation of Washing of Polymeric Fluorescent Substance (1) with an Acid

The polymeric fluorescent substance (1) (0.4 g) synthesized by the above method was dissolved in 200 g of chloroform. After washing the solution with 200 g of a 1% aqueous solution of tartaric acid, the phases of the solution were separated to collect the chloroform layer.

After repeating this operation three times, the chloroform solution was repeatedly washed with 200 g of extrapure water five times. The chloroform solution was poured into methanol, and the produced precipitate was collected. The precipitate was washed with ethanol and then dried under a reduced pressure to obtain acid-washed, purified polymeric fluorescent substance (2).

With respect to the respective polymeric fluorescent substances (1) and (2), the results of quantification of metal elements by an ICP light emitting analysis method are shown in Table 1. In purified polymeric fluorescent substance (2), the amounts of potassium and iron were reduced.

TABLE 1

| Impurity (mg/kg) | Potassium | Iron |
|---|---|---|
| Polymeric fluorescent substance (1) | 0.4 | 1.9 |
| Polymeric fluorescent substance (2) | 0.1 | 1.1 |

EXAMPLE 2

<Production and Evaluation of Device>

A suspension of poly(3,4)ethylenedioxythiophene/polystyrenesulfonic acid (from Bayer AG, Bytron P TP AI 4083) was filtered through a 0.5 μm membrane filter and made into a film of a thickness of 70 nm by spin coating onto a glass substrate having an ITO film of a thickness of 150 nm formed thereon by a sputtering method. The film was dried in a vacuum oven at 120° C. for 1 hour. Then, a light emitting layer of a thickness of 70 nm was formed by spin coating of a 0.4 wt % solution of polymeric fluorescent substance (2) in chloroform. After further drying this film at 80° C. under a reduced pressure for 1 hour, a polymer LED device was produced by depositing about 0.4 nm equivalent of lithium fluoride, 40 nm of calcium and then 70 nm of aluminum as a cathode. All the degrees of vacuum at the time of the deposition were $8 \times 10^{-6}$ Torr or less. When a voltage of 3.0 V was applied to the resultant device, a current with a current density of 2.5 mA/cm$^2$ flew and yellow EL light emission with a luminance of 320 cd/m$^2$ was observed. The luminous efficiency at this time was 13 cd/A, and the light emission spectrum of the device had a peak at 548 nm. After aging the device under a nitrogen stream for 1 hour, the device was continuously driven with a constant current of 25 mA/cm$^2$. The light emission luminance of 2,000 cd/m$^2$ was reduced to the half after about 60 hours.

COMPARATIVE EXAMPLE 1

A polymer LED was produced by using polymeric fluorescent substance (1) before purification instead of purified polymeric fluorescent substance (2) in the same manner as in Example 2. When a voltage of 3.0 V was applied to the resultant device, a current with a current density of 1.0 mA/cm$^2$ flew and yellow EL light emission with a luminance of 110 cd/m$^2$ was observed. The luminous efficiency at this time was 11 cd/A, and the light emission spectrum of the device had a peak at 548 nm. After aging the device under a nitrogen stream for 1 hour, the device was continuously driven with a constant current of 25 mA/cm$^2$. The light emission luminance of 2,100 cd/m$^2$ was reduced to the half after about 45 hours. The life was shorter than that of the device of Example 2.

EXAMPLE 3

<Synthesis of Polymeric Fluorescent Substance 3>

9,9-Dioctylfluorene (26.3 g), 9,9-diisopentylfluorene (5.6 g), 2,2'-bipyridyl (22 g) were dissolved in 1.6 L of dehydrated THF under nitrogen. Bis(1,5-cyclooctadiene)nickel (O) (40 g) was added to the mixture and stirred under heating at 60° C. for 8 hours. After cooling, the reaction mixture was poured into a mixed solution of methanol (1.2 L)/water (1.2 L)/25% ammonia water (200 ml) and the precipitate obtained was separated by filtration. The resultant precipitate was dried, dissolved in toluene (1.1 L), and then added dropwise to methanol (3.3 L). The precipitate obtained was separated by filtration and then dried under a reduced pressure to obtain polymeric fluorescent substance 3 (21 g).

<Synthesis of Purified Polymeric Fluorescent Substance 4>

The polymeric fluorescent substance 3 (10 g) synthesized by the above method was dissolved in toluene (1.44 L). The resultant solution was washed with 1N hydrochloric acid (1.0 L) and then the phases of the solution were separated to collect a toluene layer. The toluene layer was washed with 2% aqueous ammonium solution (1.1 L) and then with 2 portions of pure water (1.0 L). The toluene solution was poured into methanol (3.0 L), and the purified precipitate was collected. The precipitate was dried under a reduced pressure to obtain purified polymer 4 (9.7 g).

<Evaluation of Fluorescence Property>

A thin film of the purified polymeric fluorescent substance 4 was produced by spin coating a solution of 0.4 wt % purified polymeric fluorescent substance 4 in chloroform on quartz. The ultraviolet visible absorption spectrum and the fluorescence spectrum of the thin film were measured by use of an ultraviolet visible absorption spectrometer (Hitachi, Ltd. UV3500) and a fluorescence spectrometer (Hitachi, Ltd. 850). A fluorescence spectrum excited at 350 nm was used for calculation of the fluorescent intensity. An area of the fluorescence spectrum plotted by taking the wave number on the abscissa was divided by the absorbance at 350 nm to obtain the relative value of the fluorescent intensity.

The fluorescence peak wavelength of the purified polymeric fluorescent substance 4 was 428 nm, and the relative value of the fluorescent intensity was 5.9.

COMPARATIVE EXAMPLE 2

A thin film was produced by using polymeric fluorescent substance 3 before purification instead of purified polymeric fluorescent substance 4 in the same manner as in Example 3. The fluorescence peak wavelength of the resultant polymeric fluorescent substance 3 was 428 nm, and the relative value of the fluorescent intensity was 3.3.

INDUSTRIAL APPLICABILITY

The polymer LED using the polymeric fluorescent substance produced by the method of the present invention has a long life. Therefore, the polymer LED can be preferably used in devices such as a curved light source or sheet-shaped light source as a backlight, segment type display device or dot matrix flat panel display.

The invention claimed is:

1. A method for producing a polymeric fluorescent substance characterized by comprising the step of treating with an acid a polymeric fluorescent substance that is fluorescent in a solid state and has a polystyrene equivalent number average molecular weight of $1\times10^4$ to $1\times10^8$ and contains at least one repeating unit represented by the following formula (1):

$$-Ar_1-(CR_1=CR_2)_k- \qquad (1)$$

wherein $Ar_1$ represents a divalent group that forms carbon-carbon bonds with the adjacent two groups, respectively, which is an arylene group with 6 to 60 carbon atoms in the main chain moiety, or a heterocyclic compound group with 4 to 60 carbon atoms in the main chain moiety wherein said arylene group and said heterocyclic compound group may have a substituent; $R_1$ and $R_2$ each independently represent a group selected from a group consisting of a hydrogen atom, an alkyl group with 1 to 20 carbon atoms, an aryl group with 6 to 60 carbon atoms, and a heterocyclic compound group with 4 to 60 carbon atoms and a cyano group wherein said aryl group and said heterocyclic compound group may have a substituent; and k is 0 or 1.

2. A method for producing a polymeric fluorescent substance characterized by comprising the steps of treating with an acid a polymeric fluorescent substance that is fluorescent in a solid state and has a polystyrene equivalent number average molecular weight of $1\times10^4$ to $1\times10^8$ and treating it with an alkali.

3. A method for producing a polymeric fluorescent substance characterized by comprising the steps of treating with an acid a polymeric fluorescent substance that is fluorescent in a solid state and has a polystyrene equivalent number average molecular weight of $1\times10^4$ to $1\times10^8$, treating it with an alkali and treating it with a substance that does not contain an acid or an alkali.

4. The method for producing the polymeric fluorescent substance according to claim 1, wherein the step of treating with the acid reduces the amount of a metal contained in the polymeric fluorescent substance.

5. The method for producing the polymeric fluorescent substance according to claim 2, wherein the step of treating with the acid and the step of treating with the alkali reduce the amount of a metal contained in the polymeric fluorescent substance.

6. The method for producing the polymeric fluorescent substance according to claim 3, wherein the step of treating with the acid, the step of treating with the alkali and the step of treating with the substance that does not contain an acid or an alkali reduce the amount of a metal contained in the polymeric fluorescent substance.

7. The method for producing the polymeric fluorescent substance according to claim 1, wherein the step of treating with the acid reduces the amount of a base contained in the polymeric fluorescent substance.

8. The method for producing the polymeric fluorescent substance according to claim 2, wherein the step of treating with the acid and the step of treating with the alkali reduce the amount of a base contained in the polymeric fluorescent substance.

9. The method for producing the polymeric fluorescent substance according to claim 3, wherein the step of treating with the acid, the step of treating with the alkali and the step of treating with the substance that does not contain an acid or an alkali reduce the amount of a base contained in the polymeric fluorescent substance.

10. The method according to any one of claims 1 to 9, wherein the acid is an organic acid.

11. The method according to any one of claims 1 to 9, wherein the acid is an inorganic acid.

12. The method according to any one of claims 1 to 9, wherein the alkali is an organic alkali.

13. The method according to any one of claims 1 to 9, wherein the alkali is an inorganic alkali.

14. The method according to any one of claims 1 to 9, wherein the step of treating with the acid is a step of bringing a solution of the acid into contact with a solution of the polymeric fluorescent substance in a solvent.

15. The method according to claim 2, 3, 5, 6, 8 or 9, wherein the step of treating with the alkali is a step of bringing a solution of the alkali into contact with a solution of the polymeric fluorescent substance in a solvent.

16. The method according to claim 3, 6 or 9, wherein the step of treating with the substance that does not contain an acid or an alkali is a step of bringing a solution that does not contain an acid or an alkali into contact with a solution of the polymeric fluorescent substance in a solvent.

17. The method according to claim 3, 6 or 9, wherein the step of treating with the substance that does not contain an acid or an alkali is a step of bringing a solid substance that does not contain an acid or an alkali into contact with a solution of the polymeric fluorescent substance in a solvent.

* * * * *